United States Patent
Collins et al.

(10) Patent No.: US 11,738,373 B2
(45) Date of Patent: Aug. 29, 2023

(54) VENTILATION AND PARTICULATE MATTER REMOVAL SYSTEM

(71) Applicant: SYNERGETICS PTY LTD., West Melbourne (AU)

(72) Inventors: David Hayden Collins, Parkville (AU); James Brett, West Melbourne (AU); James Forsyth, Cheltenham (AU); Rolf Meumann, West Melbourne (AU)

(73) Assignee: Synergetics Pty. Ltd.

( * ) Notice: Subject to any disclaimer, the term of this patent is extended or adjusted under 35 U.S.C. 154(b) by 82 days.

(21) Appl. No.: 17/050,809

(22) PCT Filed: Apr. 29, 2019

(86) PCT No.: PCT/AU2019/000050
§ 371 (c)(1),
(2) Date: Oct. 26, 2020

(87) PCT Pub. No.: WO2019/204856
PCT Pub. Date: Oct. 31, 2019

(65) Prior Publication Data
US 2021/0046520 A1 Feb. 18, 2021

(30) Foreign Application Priority Data

Apr. 27, 2018 (AU) .............................. 2018901409
Aug. 17, 2018 (AU) .............................. 2018903037
Mar. 24, 2019 (AU) .............................. 2019900979

(51) Int. Cl.
*B08B 5/02* (2006.01)
*B08B 5/04* (2006.01)
(Continued)

(52) U.S. Cl.
CPC .................. *B08B 5/02* (2013.01); *B08B 5/04* (2013.01); *B08B 9/093* (2013.01); *B08B 13/00* (2013.01);
(Continued)

(58) Field of Classification Search
CPC .. B08B 5/02; B08B 5/04; B08B 9/093; H05K 7/20136; F24F 2110/64
See application file for complete search history.

(56) References Cited

U.S. PATENT DOCUMENTS 6,195,834 B1 * 3/2001 Shteingold ................ B08B 7/02
15/345
2012/0160269 A1 * 6/2012 Pyo ........................ D06F 58/44
134/25.1

FOREIGN PATENT DOCUMENTS

CN 105485862 A * 4/2016
CN 205429520 U 8/2016
(Continued)

OTHER PUBLICATIONS

Machine translation—CN205628781; Li et al. (Year: 2016).*
International Search Report and Written Opinion dated Jul. 29, 2019 in PCT/AU2019/000050.

*Primary Examiner* — Natasha N Campbell
(74) *Attorney, Agent, or Firm* — Anderson Gorecki LLP

(57) ABSTRACT

Apparatus for removing particulate matter from an enclosure having an internal space and an opening into the internal space, comprising:
a cover positionable adjacent the opening so that the cover covers the opening;
a gas source external to the internal space;
an inlet conduit that in use extends through the cover and is adapted to direct gas from the gas source to at least one gas outlet within the internal space whereby particulate matter within the internal space is dislodged and entrained in gas within the internal space;
(Continued)

a source of partial vacuum adapted to maintain a partial vacuum within the enclosed space and to draw gas and particulate matter entrained therein from the internal space firstly through an outlet conduit and then through a particulate matter separation means comprising at least one filter;

a sensor for sensing concentration of particulate matter in gas leaving the enclosed space;

a display adapted to provide to a user information on concentration of particulate matter leaving the internal space so that the operator can continue use of gas from the gas source to dislodge particulate matter in the internal space until a satisfactory value of the concentration is achieved.

28 Claims, 28 Drawing Sheets

(51) Int. Cl.
*B08B 9/093* (2006.01)
*B08B 13/00* (2006.01)
*B08B 15/02* (2006.01)
*F24F 3/16* (2021.01)
*G01N 15/06* (2006.01)
*F24F 110/64* (2018.01)
*H05K 7/20* (2006.01)

(52) U.S. Cl.
CPC ............... *B08B 15/02* (2013.01); *F24F 3/16* (2013.01); *G01N 15/06* (2013.01); *H05K 7/20136* (2013.01); *F24F 2110/64* (2018.01)

(56) References Cited

FOREIGN PATENT DOCUMENTS

| CN | 205628781 U | 12/2016 |
| CN | 107321711 A | 11/2017 |
| CN | 207183892 U | 4/2018 |
| JP | 2004154212 A * | 6/2004 |

* cited by examiner

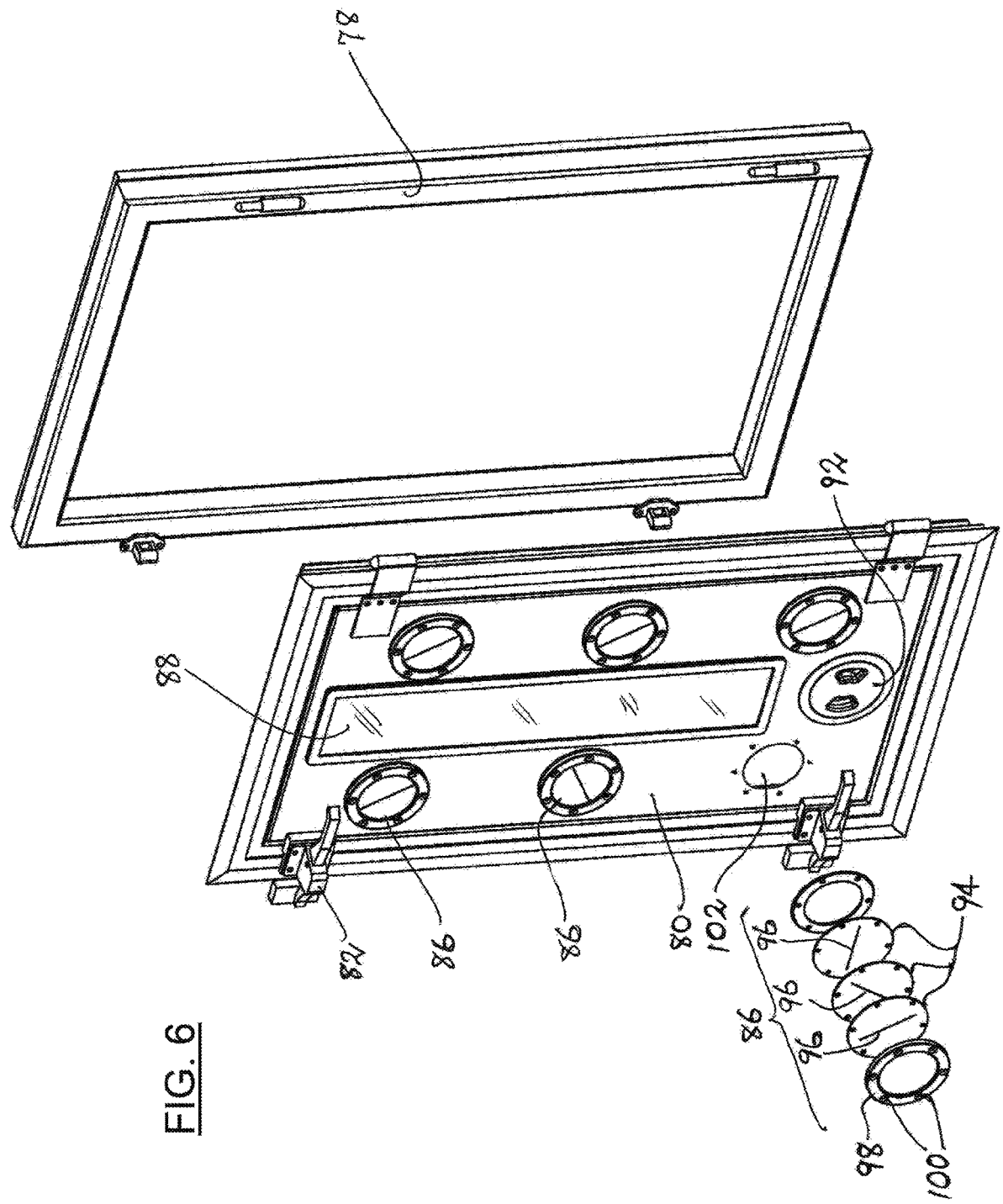

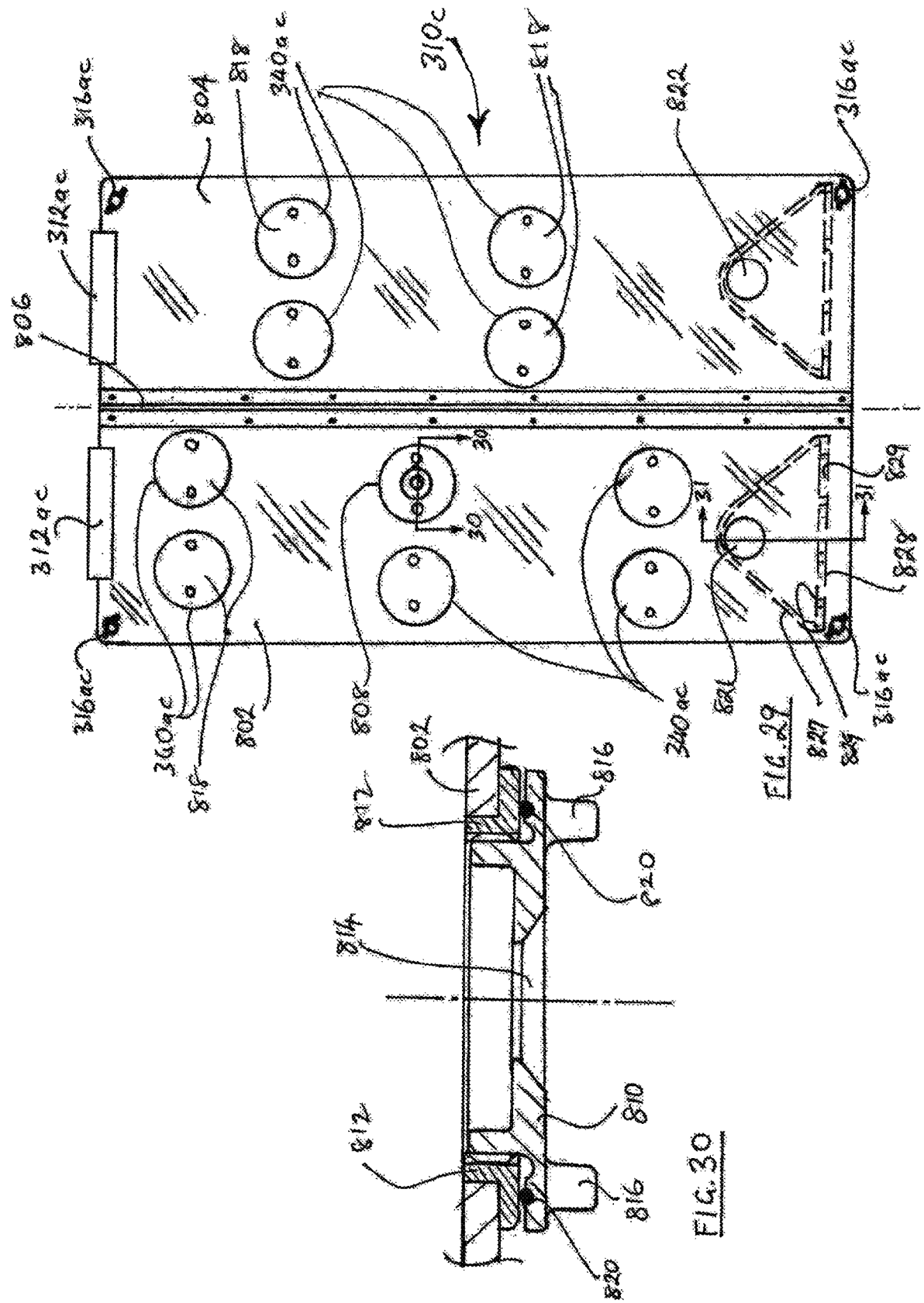

VENTILATION AND PARTICULATE MATTER REMOVAL SYSTEM

CROSS-REFERENCE TO RELATED APPLICATIONS

This application is a national stage application, filed under 35 U.S.C. § 371, of International Patent Application No. PCT/AU2019/000050, filed on 29 Apr. 2019, which claims priority to and the benefit of: AU2018901409, filed 27 Apr. 2018; AU2018903037, filed 17 Aug. 2018; and AU2019900979, filed 24 Mar. 2019. Each of the aforementioned applications is incorporated by reference herein in its entirety.

FIELD

Apparatus systems and methods are disclosed for removal of particulate matter from enclosed spaces and enclosures, with particular reference to removal of dust, dirt and the like from enclosed cabinets containing electrical components.

BACKGROUND

In many industries, electrical, electronic and other sensitive equipment is housed in enclosures designed to provide a safe and clean operating environment for that equipment and to prevent unauthorized or inadvertent access. This can be the case in both fixed industrial installations and mobile equipment.

Although such enclosures are generally designed and maintained to prevent or limit ingress of particulate matter, for example dust and dirt, it has been found in some applications that enclosures do sometimes need to be cleaned out of such particulate matter. Failure to do so in these applications can eventually threaten proper operation of the electrical or electronic equipment.

For example, in the mining industry, haul trucks with diesel-electric drives have enclosures (cabinets) for electrical components which are sometimes found to accumulate significant quantities of particulate matter, even when carefully maintained, but particularly with ageing and when maintenance is imperfect. Other mobile equipment used in the surface mining industry, e.g. electric blasthole drills, shovels and draglines may have enclosures that are similarly affected.

Cleaning out of particulate matter from such enclosures to a suitable standard of cleanliness can itself be difficult and time consuming. Water cleaning is unsuitable for cleaning electrical and electronic equipment. Vacuum cleaning is often ineffective in removing particulate matter from spaces within and between components. The use of compressed air can create occupational, environmental and ecological exposure risks from airborne particulate matter.

It is believed that there are other areas of activity including for example underground mining, and certain aboveground industrial/manufacturing installations in which the above problems occur. In some of these, the particulate matter in question may be considered toxic either inherently because of its chemistry or because of factors such as particle size or shape or even the expected sensitivity of persons likely to be exposed to the matter.

Disclosed herein are equipment, systems and methods for addressing the problem of cleaning particulate matter from enclosed spaces.

In this specification, no reference to prior art or to what is known, is to be taken as a concession that anything is a part of the common general knowledge in Australia or elsewhere.

DISCLOSURE OF THE INVENTION

In a first aspect the invention provides apparatus for removing particulate matter from an enclosure having an internal space and an opening into the internal space, comprising:
  a cover positionable adjacent the opening so that the cover covers the opening;
  a gas source external to the internal space;
  an inlet conduit that in use extends through the cover and is adapted to direct gas from the gas source to at least one gas outlet within the internal space whereby particulate matter within the internal space is dislodged and entrained in gas within the internal space;
  a source of partial vacuum adapted to maintain a partial vacuum within the enclosed space and to draw gas and particulate matter entrained therein from the internal space firstly through an outlet conduit and then through a particulate matter separation means comprising at least one filter;
  a sensor for sensing concentration of particulate matter in gas leaving the enclosed space;
  a display adapted to provide to a user information on concentration of particulate matter leaving the internal space so that the operator can continue use of gas from the gas source to dislodge particulate matter in the internal space until a satisfactory value of the concentration is achieved.

Preferably the outlet conduit is in use secured to the cover and draws gas through an opening in the cover.

Preferably the or at least one gas outlet is movable relative to the cover among multiple positions within the internal space.

Preferably the gas outlet is at an end of an elongate tubular lance comprised in the inlet conduit, the lance in use extending though a port in the cover so that a portion of its length is in the internal space and the user can manually move the lance to cause the gas outlet to takes up any of the said multiple positions within the internal space.

Preferably the port in the cover is one of a plurality of ports in the cover so positioned that the user can withdraw the lance from one port and enter the lance into another port as required to access multiple parts of the internal space.

Preferably each of the plurality of ports has a restriction adapted to restrict flow of gas and particulates therethrough when the port does not have the lance extending through it.

Preferably, the apparatus further comprises control apparatus for stopping flow of gas from the gas source to the at least one gas outlet by the user.

Preferably the control apparatus is operable automatically in response to sensed pressure within the internal space rising to a predetermined threshold level to interrupt flow to the at least one gas outlet.

Preferably the apparatus further comprises a sensor for sensing concentration of particulate matter in gas discharged from the apparatus downstream of the source of partial vacuum.

In a further aspect the invention provides a method for removing particulate matter from an enclosure having an internal space and an opening into the internal space, comprising the steps of:
  positioning a cover adjacent the opening so that the cover covers the opening;

providing a gas source external to the internal space;
providing an inlet conduit that in use extends through the cover and is adapted to direct gas from the gas source to at least one gas outlet within the internal space whereby particulate matter within the internal space is dislodged and entrained in gas within the internal space;
providing a source of partial vacuum adapted to maintain a partial vacuum within the enclosed space and to draw gas and particulate matter entrained therein from the internal space firstly through an outlet conduit and then through a particulate matter separation means comprising at least one filter;
providing a sensor for sensing concentration of particulate matter in gas leaving the enclosed space;
using the sensor to derive and provide to a user information on concentration of particulate matter leaving the internal space;
the user using gas from the gas source to dislodge particulate matter in the internal space until a satisfactory value of the concentration is achieved.

Preferably the method further comprises the steps of:
repeatedly sensing concentration of particulate matter in gas leaving the internal space during cleaning thereof and making into digital records thereof;
time stamping each digital record and transmitting using a digital data network the digital records to a remote location for recording and approval.

The method may include the step of repeatedly sensing pressure within the internal space during cleaning thereof and including in the transmitted digital records sensed values of pressure within the internal space.

Preferably the method includes the steps of:
further providing a sensor for sensing concentration of particulate matter in gas discharged from the apparatus downstream of the source of partial vacuum;
repeatedly sensing concentration of particulate matter in gas discharged to atmosphere downstream of the source of partial vacuum and including in the transmitted digital records sensed values thereof.

Further embodiments and additional features and inventive concepts are described in the following detailed description, based on the attached drawings.

Everywhere in this specification, the word "comprise" and derivatives thereof including "comprising", "comprised" and the like, when used in relation to items, elements or steps, are to be taken as indicating presence of those items elements or steps, but not as precluding the possible presence of other items, elements or steps.

Everywhere in this specification, the terms "particulate" and "particulates" are to be understood as short and convenient terms for particulate matter. It is further to be understood that the particulate matter described will in some applications comprise particles with a range of sizes. Except where otherwise stated, the terms "sealingly" and "gas-sealingly", where used in this specification in relation to two parts or elements, are to be taken to mean that gas and particulate matter entrained in that gas are wholly or substantially or at least to a useful degree prevented from leaking or passing between the two parts or elements.

BRIEF DESCRIPTIONS OF THE DRAWINGS

FIG. 1(b) is a perspective view of an enclosure being cleaned;
FIG. 1(a) is a cross-sectional view of the enclosure shown in FIG. 1(b) being cleaned;
FIG. 2 is a schematic diagram showing components of a cleaning system according to an aspect of the invention and connections between those components;
FIG. 3 is a block diagram of instrumentation and control components;
FIG. 4 is a perspective view of a cabinet for electrical components partially modified to implement the invention;
FIG. 5 is a partial exploded perspective view of the cabinet shown in FIG. 4;
FIG. 6 is a perspective partially exploded view of an assembly comprising a frame and door of the cabinet shown in FIG. 4;
FIG. 7 is a front elevation of the cabinet shown in FIG. 4;
FIG. 8 is a partial section of the cabinet of FIG. 7, the section being taken at station BB in FIG. 7;
FIG. 9 is an enlarged view of detail A of FIG. 8;
FIG. 10 is a sectional view of the cabinet as shown in FIG. 7, the section being taken at station DD of FIG. 6;
FIG. 11 is a vertical section through an alternative port assembly according to the invention, when in use;
FIG. 12 is a vertical section equivalent to FIG. 11 showing the alternative port assembly of FIG. 11, now when not in use.
FIG. 13 is a view exactly equivalent to FIG. 8 of a temporary version of the frame shown in FIG. 8;
FIG. 14 is a vertical section view of an enclosure fitted with a temporary cover according to an embodiment of the invention;
FIG. 15 is a side view of a cleaning lance according to the invention fitted with a collar assembly;
FIG. 16 is a perspective view of a cabinet and a further cover assembly positioned ready to be secured to the cabinet;
FIG. 17 is an elevation of a clamp assembly as shown in FIG. 16 and as seen looking in the direction of arrow "17";
FIG. 18 is a cross-sectional view of a port assembly of the cover shown in FIG. 16;
FIG. 19 is a perspective view of the port assembly shown in FIG. 18;
FIG. 20 is a sectional view of an enclosure showing a method of blowing gas according to the invention that is an alternative to that of FIG. 1(a);
FIG. 21 is a sectional view of an enclosure showing an method of blowing gas according to the invention that is an alternative to that of FIG. 1(a);
FIG. 22 is a side view of an open-topped railcar (whose upper section is shown in longitudinal cross-section) and a cleaning apparatus according to a further aspect of the invention;
FIG. 23 is a side view, with one portion shown in section, of an assembly of components of the system shown in FIG. 2;
FIG. 24 is a perspective view of a cabinet and a further cover assembly positioned ready to be secured to the cabinet;
FIG. 25 is a longitudinal central section of a shipping container (with some detail omitted) fitted with particulate removing equipment;
FIG. 26 is a longitudinal central section (equivalent to FIG. 25) of a shipping container (with some detail omitted) fitted with alternative particulate removing equipment;
FIG. 27 is a longitudinal central section of a barrel-type container fitted with apparatus for removing particulate matter;
FIG. 28(a), FIG. 28(b), and FIG. 28(c) are a set of three schematic diagrams showing different ways in which the apparatus and methods described herein may be applied;

FIG. 29 is an elevation of an exterior side of a further enclosure cover according to the invention;

FIG. 30 is a partial cross-section taken at station "30-30" in FIG. 29;

DETAILED DESCRIPTION OF PREFERRED EMBODIMENTS

Figure 1B:
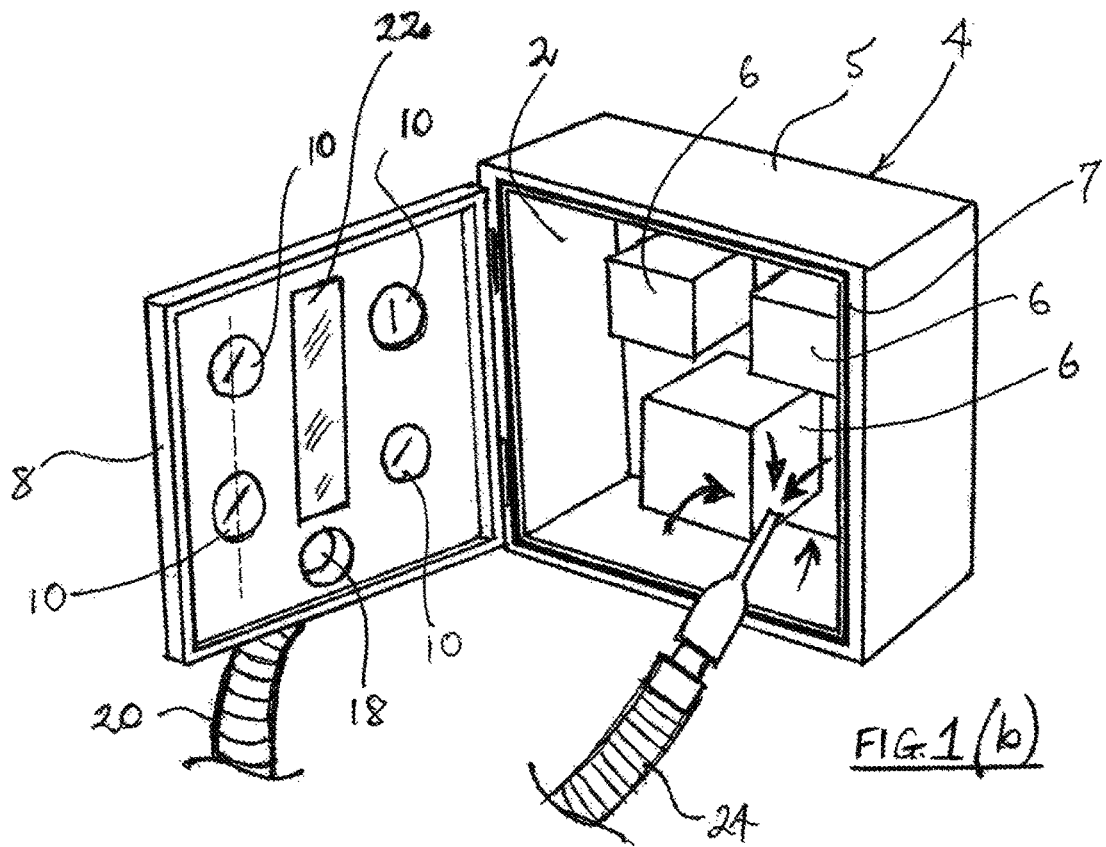
Figure 1A:
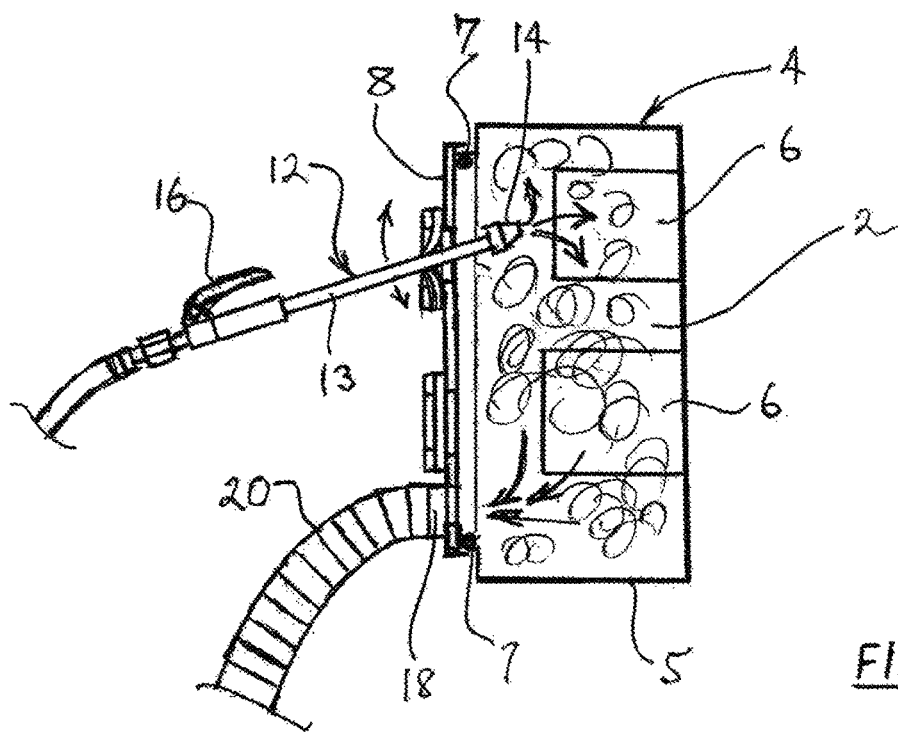
Figure 2:
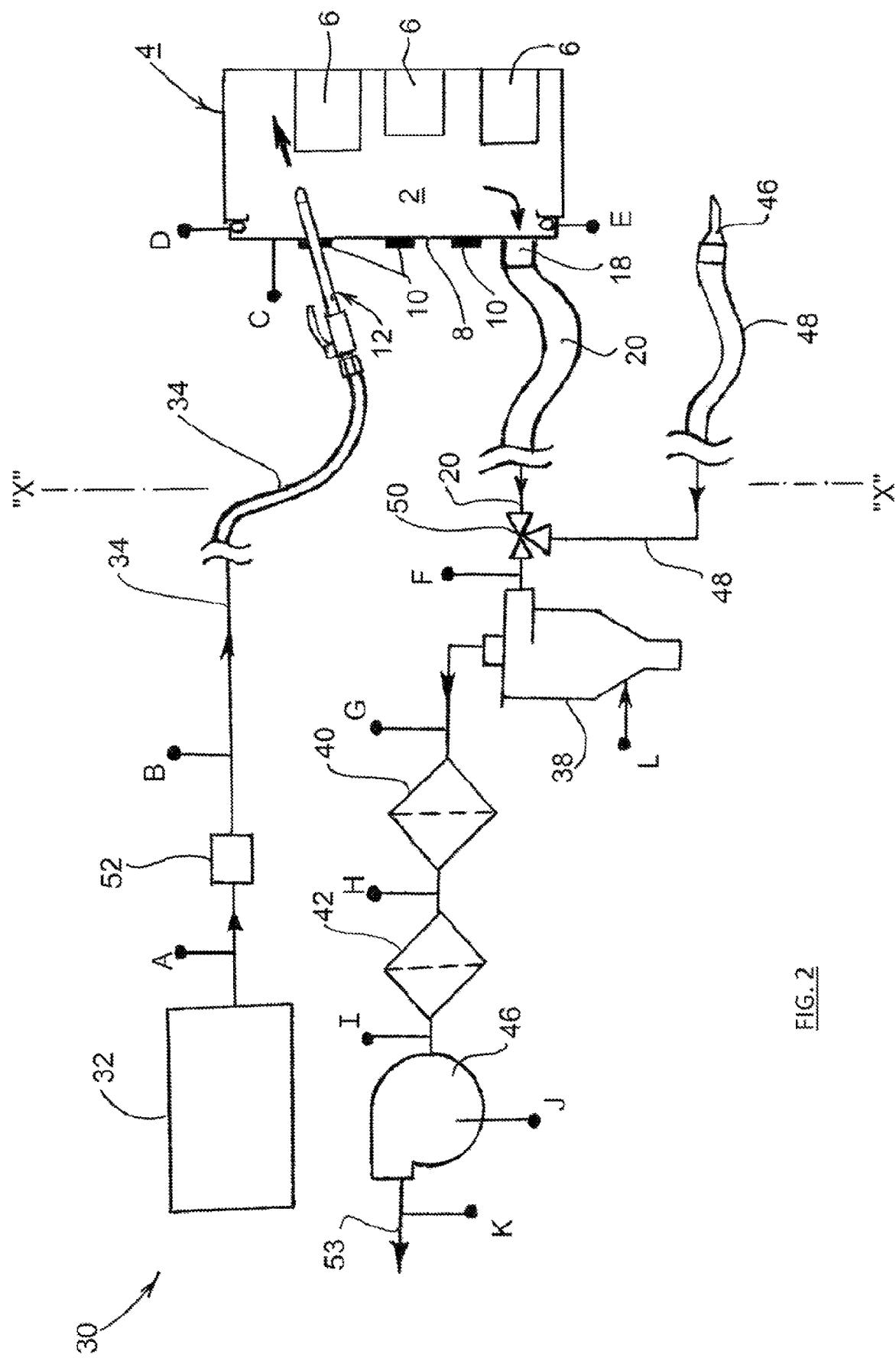
Figure 3:
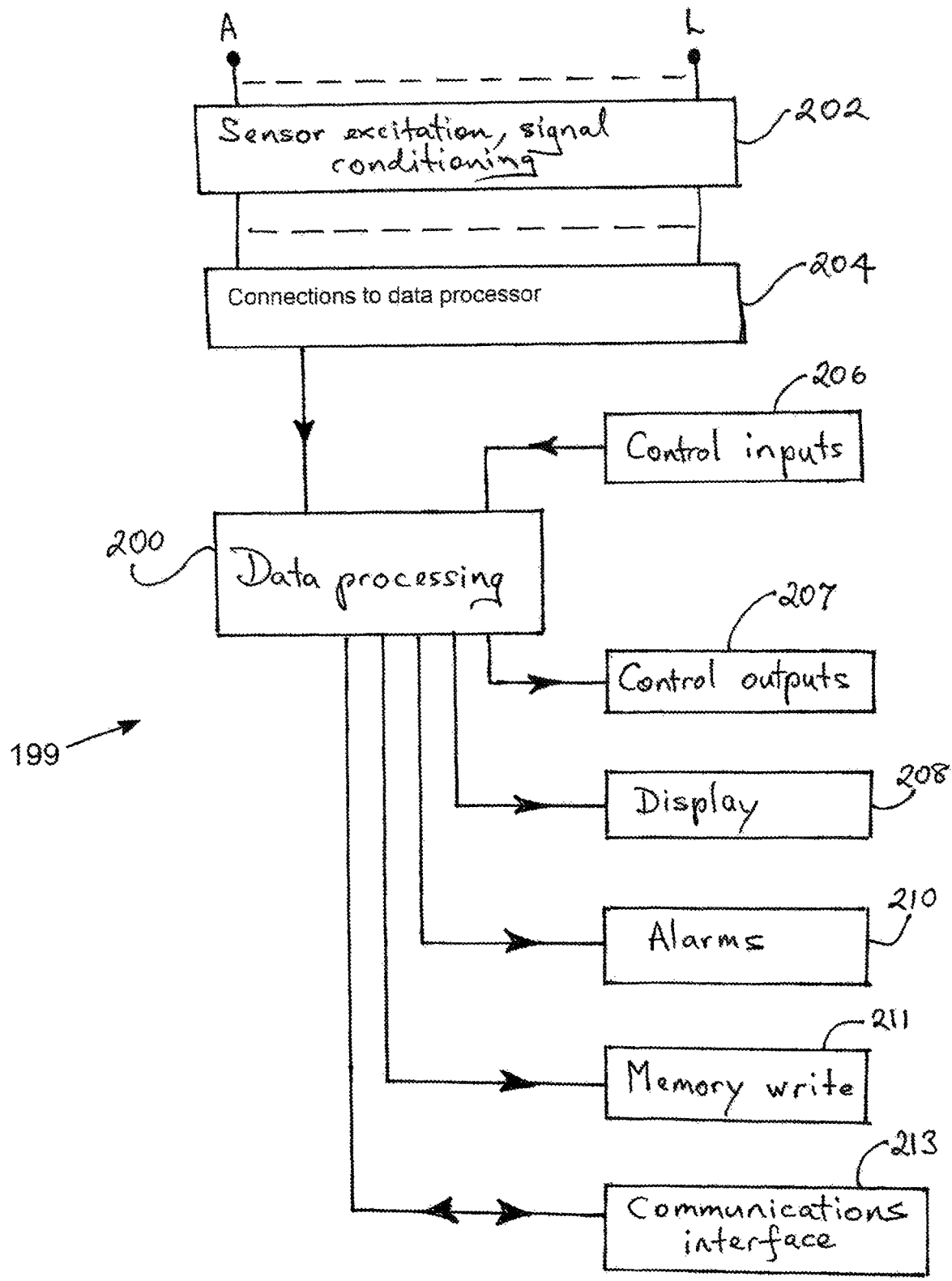
Figure 4:
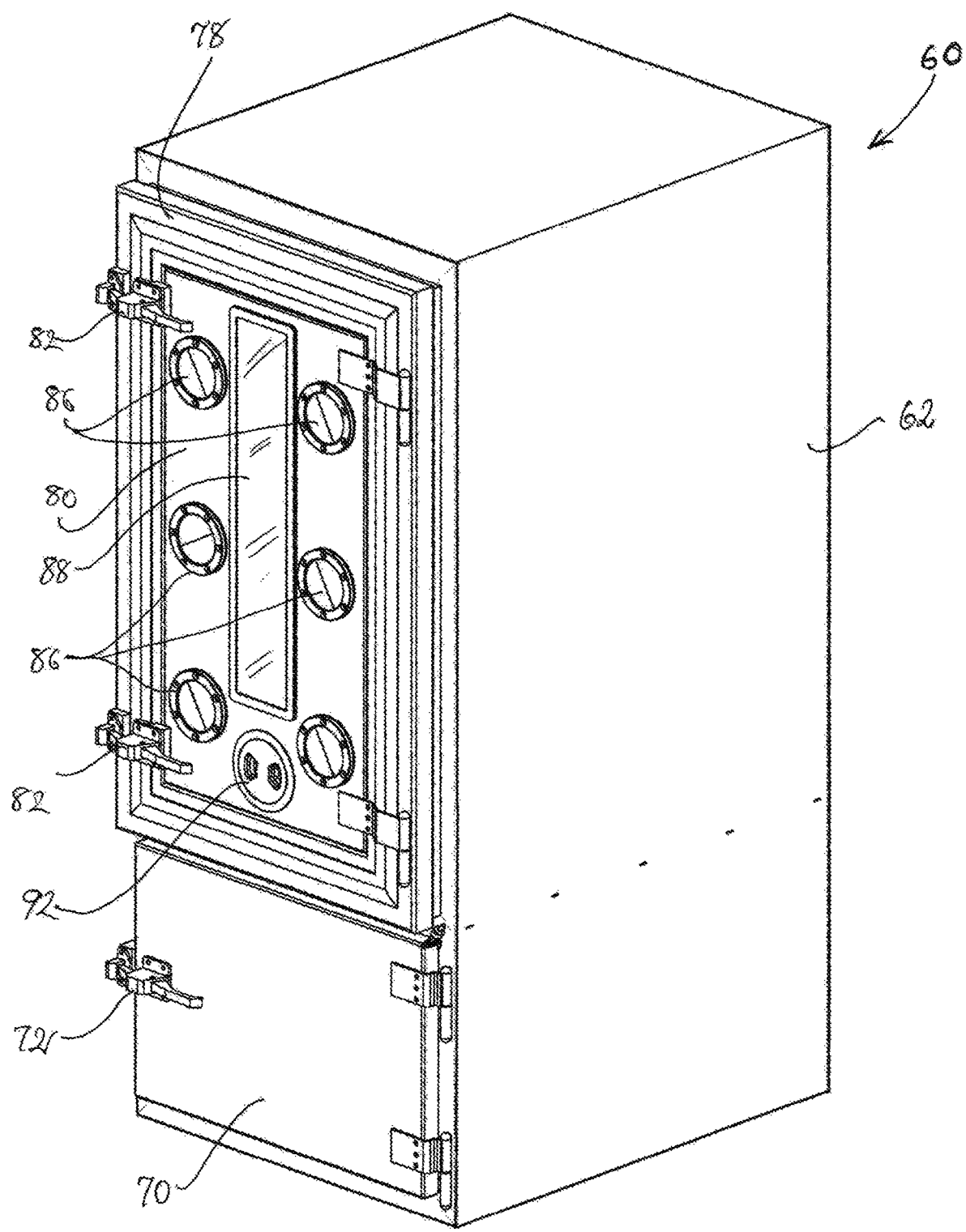
Figure 5:
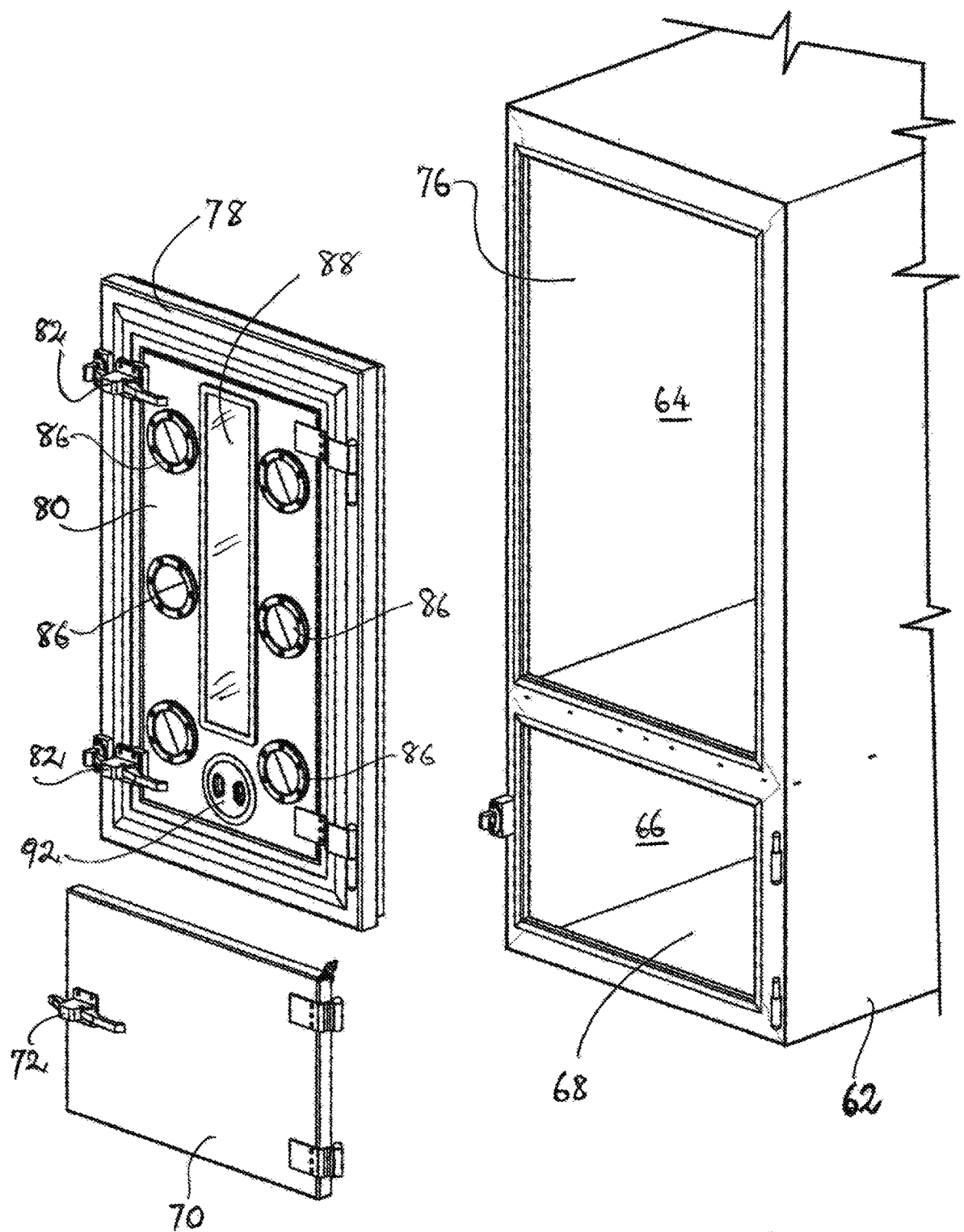
Figure 8:
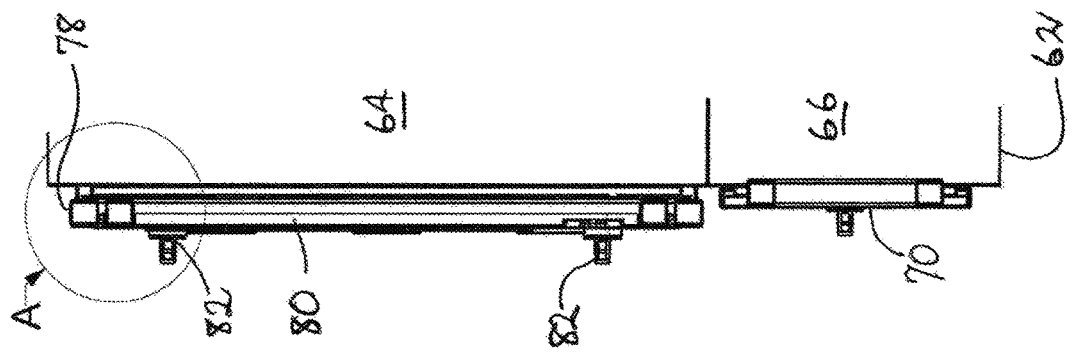
Figure 7:
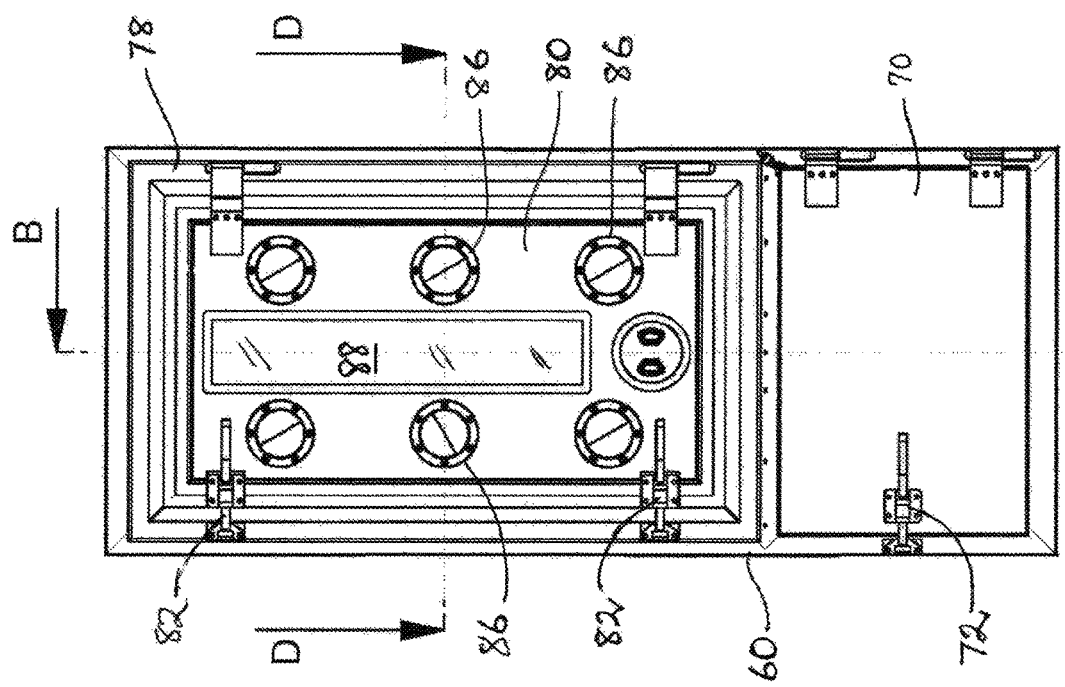

The following description, based on FIGS. 1-3, is based for convenience on arrangements and methods for cleaning particulates from cabinets such as those used for containment of electrical and electronic components and the like. However, other arrangements and applications are disclosed subsequently by reference to FIGS. 4-28, and it is to be understood that the same principles are applicable to them.

FIGS. 1(a) and 1(b) show schematically how an internal space 2 of a cabinet (that is, an enclosure) 4 containing electrical (or other) components 6 can have accumulations of particulates removed.

A door 8 of cabinet 4 seals against fixed part 5 of cabinet 4 due to a seal 7 that extends peripherally around the edge of door 8. Door 8 has at least one port assembly 10 through which a rigid, elongate cleaning lance 12 can be inserted so that a part of its length is in internal space 2. Cleaning lance 12 is elongate and tubular and provided with gas from a source 32 (see FIG. 2) external to cabinet 4, the gas being expelled in a stream or jet from a nozzle 14, nozzle 14 being inside internal space 2 during that part of the cleaning process shown in FIG. 1(b). In some embodiments, cleaning lance 12 has a manually operable valve 16 for control (including shutoff) of gas flow through nozzle 14. Blowing a stream or jet of gas into internal space 2, as shown in FIG. 1(a), allows dislodgement of particulates from internal surfaces of cabinet 4 and components 6 and agitation of dislodged particulates so that they are entrained in gas within the internal space 2. Cleaning lance 12 can be manipulated by a user outside enclosure 4 so as to move the stream of gas ejected from it inside enclosure 4.

Cabinet 4 also has at least one outlet port 18 through which gas and entrained particulates can leave internal space 2 and be drawn into a duct 20 by an external source (see item 46, FIG. 2) of at least partial vacuum. As will be described further below, at least some of the particulates removed through outlet port 18 are removed from the gas downstream of outlet port 18. Outlet port 18 is shown as comprised in door 8, but may in alternative embodiments (not shown) be comprised in fixed part 5 of cabinet 4. The position of the outlet port is selected to benefit from gravitational settling and stratification of the dust so that the dust can be extracted as completely as possible. Further, an extension duct (not shown) may be fitted to the outlet port 18 to move the location from which gas and entrained particulates further into the enclosure 4. (This approach may also be taken in other embodiments described below.)

Cleaning lance 12 can be manually oriented (as shown by arrows 15), and the extent of its penetration into space 2 varied (as shown by arrows 17), by a user of cleaning lance 12 to orient and position nozzle 14 to best effect for dislodging particulates. Door 8 is provided with a transparent viewing window 22 so that the cleaning lance 12 in internal space 2 can be seen during cleaning. The purpose of providing multiple ports 10 is to enable a user to withdraw cleaning lance 12 from one port 10 and then insert it into another port 10 so as to dislodge particulates in multiple locations in internal space 2.

Cleaning lance 12 is a gas discharging device and essentially comprises a gas flow control valve 16 for manual operation by a user and an elongate tube 13 through which gas leaving valve 16 passes to nozzle 14 from which it issues in a gas stream or jet. Nozzle 14 may be of any suitable form or may be omitted altogether so that gas simply issues from an open end of tube 13. Nozzle 14 may direct gas at an angle to the length of tube 13, for example, or may even be freely rotatable about a lengthwise axis of tube 13 and expel gas at an angle to tube 13 such that reaction force from the gas stream causes the nozzle 14 and its emerging jet of gas to rotate. Nozzle 14 may optionally simply comprise an open end of tube 13, but in other embodiments would comprise a fixture that causes gas to increase in speed (hence momentum) as it leaves tube 13. Such a nozzle 14 may be detachable from tube 13.

In use of the method and apparatus illustrated in FIG. 1(a), particulate dislodgement and removal from the internal space 2 is continued until there is a satisfactorily low concentration of particulate matter entrained in the gas leaving the internal space 2. As set out below, a sensor for such concentration is provided, and information on the concentration is provided to a user so that cleaning can cease when the concentration is low enough. By maintaining a pressure in the internal space 2 that is lower than the atmosphere outside the internal space 2, leakage of particulate around the door 8 or through the ports 10 during the cleaning operation is limited or prevented. Concentration measurement provides an objective criterion for ending the cleaning process.

While the methods of FIGS. 1(a) and 1(b) have been illustrated by reference to an enclosure 4 with modifications to its door 8, there will be described below embodiments in which a temporary cover is placed over an opening of an enclosure having an internal space instead of a door.

FIG. 1(b) shows another mode for particulate removal from internal space 2. Door 8 has been opened and particulates are being drawn into a duct 24 by the above (or a second) partial vacuum source. Particulate removal in this way may be done before or after a period of particulate blowing as shown in FIG. 1(a) as found appropriate or between periods of particulate blowing.

In some applications, it is appropriate to remove significant accumulations of particulates first by the method shown in FIG. 1(a) and then through use of the conventional vacuuming approach of FIG. 1(b).

Although FIG. 1(a) shows all port assemblies 10 to be provided in door 8, it is possible to provide port assemblies (not shown) in other parts (e.g. top, bottom or side walls) of cabinet 4.

The gas may be air in suitable cases or may be an inert gas such as (for example only) nitrogen or carbon dioxide (derived for example from dry ice). Inert gas may be appropriate where fire, explosion or chemical reaction is a potential hazard.

FIGS. 2 and 3 show schematically an embodiment of a cleaning system 30 that is operable as described above to remove particulates from the enclosure 4. System 30 includes an instrumentation and control system 199 that is not shown in FIG. 2, but whose functionality is illustrated separately and schematically in FIG. 3.

Referring firstly to FIG. 2, a gas source 32 is provided to direct gas to nozzle 14 through a conduit 34 which includes both a flexible hose portion 33 and cleaning lance 12. Where air is to be the gas, gas source 32 may comprise, for example, a pump or blower (centrifugal or axial or a hybrid of these) or a reciprocating-piston compressor or a container of compressed air. In some applications and facilities, a reticulated compressed air supply (not shown) may be available and a connection thereto can constitute gas source 32. Gases other than air may be used, being stored as a gas, or as a liquid or solid that changes phase on or before discharge, or generated by chemical reaction.

Conduit 34 may comprise flexible hose to enable manipulation of the cleaning lance 12.

Item 52 in FIG. 2 represents one or more components for conditioning and controlling the gas supply to lance 12. It is preferred that the gas supply is conditioned to be substantially oil- and moisture-free, and components are known in the art for achieving this. More will be said about item 52 below.

Gas and entrained particulates are drawn out of enclosure 4 through duct 20 connected to enclosure 4 at outlet port 18 and then through a cyclone separator 38 (of which one is shown, but multiple cyclones may be used if appropriate to a particular application) and filters 40 and 42 by a blower 46. Together the cyclone 38 and filters 40 and 42 remove particulate matter to a desired standard (particle size and concentration). One or more of the filters 40, 42 may be a "High Efficiency Particulate Air" (HEPA) filter. Although two filters 40 and 42 are shown in FIG. 2, this is not intended to be a limitation. More than two filters may be used, or in suitable cases even one filter only or no filter at all. Duct 20 may comprise a length of suitable flexible ducting. Where duct 20 comprises a flexible material reinforced with a spiral wire, or otherwise comprises conductive material along its length, that wire or conductive material may be preferably earthed to limit explosion risk when battery power is used for the system 30.

To draw gas and entrained particulates from the enclosure 4, a vacuum source, such as a suitable fan or blower 46 is provided so that pressure in duct 20 is reduced. As shown in FIG. 2, this may be located downstream of the cyclone 38 and filters 40 and 42.

To also enable direct vacuuming of particulates from enclosure 4 as shown in FIG. 1(b), duct 20 may be disconnected from outlet port 18 and used as vacuum hose 24. Alternatively, as shown in FIG. 2, a separate duct 48 may be provided that is connected to duct 20 via a selector valve 50 and used as duct 24. Selector valve 50 allows selection of direct vacuuming through duct 48 (as in FIG. 1(b) or removal of gas and entrained particulates as in FIG. 1(a). Duct 48 is shown with an end fitting 47 for increasing the flow velocity of flow into duct 48. Such a fitting may also be used (not shown) with duct 20 if duct 20 is used as duct 24 for direct vacuuming.

Selector valve 50, where provided, may be adapted to ensure that some suction is maintained in duct 20 even when duct 48 is in use.

In some embodiments, end fitting 47 may be of the same or similar form as lance 12, so as to be enterable into any of ports 10 and enable direct vacuuming of particulates with door 8 closed. In still further embodiments lance 12 itself is provided with an inlet for gas from the gas source 32, as above, and additionally with a connection for duct 48, allowing either suctioning via duct 48 or blowing with gas from gas source 32. In such embodiments valve 16 comprises a selector for enabling sucking or blowing.

Still another alternative to the arrangement mentioned in the previous paragraph is to use a separate vacuum cleaner (not shown) for direct vacuuming in cabinet 4.

Depending on the intended capacity of the system 30, some or all of the components shown to the left of station "XX" in FIG. 2, including relevant parts of instrumentation and control system 199 may be provided in a single enclosure. This may be a fixed installation (not shown), or wheel or skid-mounted (not shown), or even comprised in a backpack-type enclosure. In some embodiments, as stated above, gas supply 32 is simply a connection to a reticulated compressed air supply. It has been confirmed by applicants that a version of system 30 adequate for use in cleaning particulates from electrical cabinets of large diesel-electric mining haul trucks can be implemented in an enclosure the size of a small-to-medium suitcase.

Instrumentation and control system 199 will now be described, still using the electrical cabinet cleaning application shown in FIG. 1 for illustrative purposes. (Some other applications mentioned below may not require all the functionality described.) Locations in the system 30 which may be provided with sensors of various types are labelled A to L in FIG. 2.

FIG. 2 is not intended as a detailed indication of hardware components and their connections. It is intended to explain what the system 199 does. The functions are straightforward enough for persons of ordinary skill in the art to implement without more specific detail.

Sensors and associated signal conditioning may be provided in system 30 for the following purposes:
  (a) to ensure that when particulates are being removed by entrainment, as in FIG. 1(a), it is able to be known when a satisfactorily low concentration of particulates is entrained in gas being drawn from the enclosure being cleaned (e.g. cabinet 4), (whichever one of port assemblies 10 is in use) so that that process is complete;
  (b) to enable monitoring of gas leaving blower 46 to ensure it has a satisfactorily low concentration of entrained particulates, so that persons near the point of discharge of gas leaving blower 46 are protected from harm;
  (c) to enable monitoring of the operation of the various particulate-separation components of the system 30 and so ensure that filters 40 and 42 and cyclone 38 (in particular) are cleaned or emptied when appropriate and blower 46 cleaned if necessary;
  (d) to ensure that components 6 in the enclosure being cleaned (e.g. 4, 60) and blower 46 are not exposed to unsafe/damaging temperature levels;
  (e) to enable monitoring of pressure in the enclosure 4 being cleaned to ensure it remains in a range where there is neither damage to the enclosure 4 nor leakage of particulates from the enclosure 4, in particular by maintaining pressure in the enclosure below atmospheric pressure in the surroundings where work is being carried out;

(f) to enable monitoring of the position and/or functioning of the seal 7 and door 8; and (g) to provide necessary inputs for automatic control of parts of the system 30;

(h) to enable remote (or local) monitoring of the condition of the various parts of the system, so that maintenance and servicing can be carried out in a timely fashion.

Depending on requirements of particular applications and users, embodiments may comprise sensors for all or some only of these purposes. Outputs from the sensors can be used in some or all of the following several ways, as follows:

First, sensor outputs may be displayed directly as numerical measures—for example, pressure or blower 46 temperature in the enclosure being cleaned may be displayed on a suitable display. Alternatively, they can be displayed as "OK/Not OK" visual signals—for example it may be sufficient to indicate that a connected gas supply has pressure enough to be used rather than display its actual value.

Second, numerical quantities may be computed from sensor outputs and displayed—for example flow rate of gas through fan 46 or cleaning lance 12. Derived quantities also may be provided only as "OK/Not OK" visual indications.

Third, audible or visible alarms can be generated where necessary and diagnostic messages displayed to guide correction by users. Further, alarm conditions may be used to trigger an automatic shutdown or otherwise limit operation of the system, i.e. to provide a "fail-safe" capability.

Fourth, sensor outputs and quantities derived from them may be recorded by a data logging facility, for verification or diagnostic purposes. For data logging, time stamping of data may be provided and even location may be recorded by provision of a GPS module. This use of sensor outputs is particularly important where it is desired not only to clean enclosures but to ensure that there is proof and/or certification of the standard of cleaning that has been carried out. This is potentially vital in applications where diseases such as silicosis, "black lung" disease and diseases associated with asbestos are to be avoided, for example. Further, purpose (h) above becomes very important in applications where logged data is to be provided to an off-site organisation for monitoring/certification purposes. Only if the equipment's condition can be maintained properly can results be relied upon.

Fifth, as well as the fail-safe capability mentioned above, automatic control of parameters and components may be provided using sensor outputs, as discussed below.

Particular choices from the above can be made according to intended applications.

Regarding purposes (a) and (b) above, the extent of particulate concentration in gas flows can be sensed using triboelectric particulate sensors. These are available from suppliers such as Auburn Filtersense LLC of Beverly, Mass., USA. While triboelectric-type sensors are suitable, other types are known in the instrumentation art and can be used as appropriate, for example sensors based on interruption or attenuation or transformation of a beam or beams of infra-red radiation, visible light, laser, beta rays or other EMF or nuclear radiation by particulates, or even acoustic-type sensors (in effect microphones) which react to impacts of particulates on a surface. The appropriate choice will depend on the particular application at hand.

Thus, to achieve aim (a) above, there may be provided one or more triboelectric (or other suitable) sensor(s) at station F (or a position upstream of it, or even inside space 2), To achieve purpose (b) above, there may be provided one or more triboelectric (or other suitable) sensor(s) at station K, downstream of the cyclone 38, filters 40 and 42 and blower 46. In some embodiments, a duct (which may be flexible) may be provided to take discharged gas and residual (i.e. unremoved) particulate well away from the area in which the cleaning operation is taking place.

Depending on the gas source, it may be appropriate to provide sensing of gas quality upstream of cleaning lance 12, for example at stations A or B. At station A, a pressure sensor may be provided to indicate, when cleaning lance 12 is not in use, that gas for blowing is available.

Regarding purpose (c) above, pressure sensors (not shown) may be provided at stations G, H and I to provide a measure of fouling of filters 40 and 42 with particulates, based on pressure drop through them, so that the need for cleaning can be indicated at an appropriate time. Rather than three such separate sensors, two differential pressure sensors (not shown) may be provided, respectively sensing pressure differences between stations G and H and H and I.

Similarly, in some embodiments either another sensor (not shown) is provided to measure the pressure difference between stations F and G, before and after the cyclone 38, or alternatively separate sensors at stations F and G can be provided. Excessive pressure difference across cyclone 38 can indicate fouling or blockage.

It is also possible to provide a pressure sensor at station K in addition to a pressure sensor at station I, so that the pressure change through blower 46 is known, or alternatively to provide a differential pressure sensor to sense the pressure change between stations I and K, i.e. across blower 46. The speed of blower 46 may be sensed at station J as well.

Also in relation to purpose (c), at station L, a sensor (not shown) may be provided to indicate that a certain quantity of particulates has been collected in cyclone separator 38 (or a particulates container (not shown) secured thereto), so that for best operation, cyclone 38 should be emptied. This may be of the optical or infra-red type, that senses interruption of a beam, these sensors being well known in the instrumentation art. Alternatively an ultrasonic type may be used, or even a simple "sight-glass" type indicator or transparent section of cyclone 38 may be provided that can be seen by a user. When a "sight-glass" type indicator is used, an LED light positioned and coloured to minimize glare may be used internally within the cyclone 38 or particulates container to enhance visual clarity.

Regarding purpose (d) above, in some embodiments, temperature of the blower 46 is sensed at station J and/or temperature of gas within space 2 is sensed at station C (or even F), in each case with suitable temperature sensors.

Regarding purpose (e) above, during use of cleaning lance 12, it is desirable that gas pressure in cabinet 4 be maintained at a level that does not lead to significant risk of particulates leakage from the cabinet 4 through for example port assemblies 10 or past seal 7 around door 8. A pressure in cabinet 4 slightly below external (atmospheric) pressure is suitable in many applications, as it limits the potential for leakage of particulates from cabinet 4.

It is also desirable that during the blowing operation, pressure in cabinet 4 not become too high or too low, to avoid distortion or even structural failure of cabinet 4. A simple approach is to provide a pressure sensor (not shown) at station C (i.e. sensing absolute pressure within space 2 of cabinet 4, or the difference between the pressure inside space 2 and the atmosphere). Actual control of the pressure in space 2 is described below. The pressure sensor (not shown)

may be located physically on the cabinet 4 or on door 8 with signals communicated to instrumentation and control system 199 via copper cable, optical fibre, wireless or other suitable means. Alternatively, the pressure sensor may be mounted away from the cabinet 4 and communicate with space 2 via a small-bore flexible tube.

Regarding purpose (f) above, it is important when blowing gas into an enclosure such as cabinet 4 that there be no leakage of air (and entrained particulates) past elastomeric seals such as seal 7 of cabinet 4, due for example to seal 7 failing to close off excessive gaps between door 8 and cabinet 4 at positions along the seal 7. For applications such as that shown in FIG. 1), where a hinged door 8 is sealed by seal 7, a single sensor (not shown) may be provided to sense whether the door 8 is in the correct position, relative to cabinet 4, for correct operation of seal 7. This could be a simple microswitch or a proximity sensor mounted to door 8 or cabinet 4. If seal 7 is a pneumatic (i.e. inflated) seal, a pressure sensor may be provided to sense pressure in the seal 7.

However, in some embodiments described below, a detachable cover (see for example item 310 in FIG. 16, item 310a in FIG. 24, item 310b in FIG. 33, item 310c in FIG. 29) is used to close off an enclosure or space. In these cases, multiple proximity or other suitable sensors (not shown) may be provided at spaced-apart positions around the cover periphery to enable monitoring of seal operation. These sensors may be of proximity type as above, or be responsive to pressure between the seal and enclosure or electrical conductivity between metallic areas on either side of the seal and facing parts of the enclosure or cover. The sensor locations would correspond for example to stations D and E in FIG. 2.

If measurement of gas flow rate to lance 12 is required, a flow meter (not shown) may be provided at station B. This could be of any suitable type, for example a venturi section or calibrated orifice plate with sensor(s) to measure the pressure change therethrough (and ideally temperature as well), or a sophisticated thermal sensor such as those available from E+E Elektronik GmbH of Germany. Also, and in the same or any other suitable way, the gas flow rate out of space 2 may be measured. This may be done at station I or station K, where the measurement is unlikely to be influenced by entrained particulates. For applications where concentrations are expected to be sufficiently small, outlet flow rate measurement may be made with sensors at any of stations F, G, H or I.

Regarding purpose (g) above, control of the blowing/entraining operation will now be described.

In some embodiments, gas flow to the cleaning lance 12 from supply 32 is simply turned on or off as required, by a user, with blower 46 running continuously. The user, as well as monitoring the extent of particulate concentration (visually, or by use of particulate concentration sensor(s) as described above) can monitor pressure in the space 2 if displayed, or simply be alert for alarms based on the sensed pressure in space 2 being, or threatening to be, out of a specified range.

A more sophisticated approach in other embodiments is to include in item 52 (FIG. 2) a solenoid valve that can interrupt (or vent to atmosphere) gas flow to cleaning lance 12 automatically if required to prevent overpressure (or loss of appropriate partial vacuum) in space 2. Similarly, blower 46 can be stopped automatically or slowed down, (or a damper operated) if required to prevent an excessively low pressure in space 2. The system 199 generates signals to control the blower 46 and/or solenoid valve in item 52, based on sensed pressure in space 2 or a mismatch of inlet and outlet flow rates.

For either of the approaches described in the previous two paragraphs, generation of an alarm and/or of automatic control signals can be anticipatory, based on rate of change of pressure or gas flow rates.

In still other embodiments, closed-loop automatic control is used, subject to maintenance of a "fail-safe" capability. For example, cleaning lance 12 may be manually controllable by a user (i.e. with gas flow rate set to off, fully on, or any intermediate value), with blower 46 and/or a variable-flow valve included in item 52 controlled automatically by system 199 to maintain a chosen value (i.e. set point) of pressure in space 2 or net gas flow rate into space 2. Alarms and/or display of operating parameters may be provided also in these embodiments. For further example, cleaning lance 12 may be simply set to "off" or "fully on", with closed loop control of a set pressure in space 2, net flow rate into the space 2, or a specified flow rate through lance 12.

Referring now to FIG. 3, block 200 represents one or more components adapted to provide the functionality described herein. It is to be understood that block 200 may simply comprise a single processor (microprocessor or otherwise) or several processors each covering a subset of the functions required. For example, if there is a closed-loop control functionality as described herein, that may have a dedicated processor. Some or all of the functions carried out within block 200 may be implemented wholly or partially by other means than microprocessors—for example field-programmable gate arrays (FPGAs) may be used to implement some functionalities. Multiple data processing components may be comprised in block 200, for example, where a variable-flow valve is included at item 52 and has its own internal electronics or where a particulate concentration sensor is provided that has its own data processing components.

The data processing componentry of block 200 is provided to receive inputs from sensors and system controls and, using these, to drive a display at 208, and/or a set of alarms at 210 and, as applicable, control outputs at 207. It may not be essential for a particular application or embodiment to provide and use all of the sensors described above. For example, in some embodiments reliance may be placed on visual inspection of cyclone 38 to determine that it needs emptying, rather than providing a sensor at station L. However, in general some sensors will be used, and block 202 represents a set of sensor excitation (i.e. powering) and any necessary signal conditioning functions, all as required to convert raw signals from the sensors to a form (digital or analog) suitable for the processing function 200. (Note that many processors have internal analog-to-digital converters and so can accept analog signals.) The triboelectric sensors of the prototype system described below provide outputs in current-loop form, while the pressure transducers provide digital outputs directly.

Block 204 represents presentation of sensor outputs to the processor at 200. For example in the prototype system described below, a multiplexer is used to provide 8 scannable channels for pressure sensors via the I$^2$C bus protocol. Multiplexing of sensor outputs may be provided if there are more sensors used than the number of inputs provided by the chosen microprocessor 200. Note that as discussed above there may be several sensors at some stations, for example a pressure sensor and a temperature sensor at station C. FIG. 2 is not intended to suggest a maximum of 12 sensors (A-L).

Block 200 may also include any or all of: automated fault detection, diagnostics and datalogging capabilities.

System 30 also requires some control inputs provided at block 206 such as on/off switches (not shown) for the blower 46 and the gas supply 32 if it includes a dedicated compressor for example, and to initiate operation of data acquisition by system 199. If any quantity is to be controlled in closed-loop manner, there may be a control (e.g. potentiometer) to provide a set point for the mass flow rate. There may also be controls (e.g. potentiometers in the case of analog control implementation) to set allowed maximum and minimum pressures in the enclosure to be cleaned.

Block 207 represents provision of signals required for automatic functions—for example shutting off the gas source 32 if pressure at station C rises too much or a continuous control signal where closed-loop pressure control is provided.

Block 208 represents provision of the function of one or more suitable display(s) for visual output of system 30 information as required. For example, there may be display of outputs for particulate concentration from triboelectric sensors at stations F and K. Displays (not shown) may use any suitable technology, for example LED, LCD or OLED. The two last of these may be of a touch screen type arranged to receive any or all of the inputs mentioned in relation to block 206 above.

Block 210 represents provision of a separate display of alarm conditions for system 30. For example, it may indicate that cyclone 38 requires emptying or that filters 40 or 42 have pressure drops indicating that they need cleaning, or that pressure in the enclosure being cleaned is outside its set limits, risking damage or particulates leakage. Such alarm functions may actually be incorporated in and displayed on the display 208, or may be provided separately, for example using a known "traffic light" format (not shown) based on green, yellow and red LEDs to indicate respectively—no alarm or normal operation, warning, alarm condition.

The following is a list of conditions and responses that may be automatically recognized and caused within block 200 to generate alarms or control signals that provide system 30 with a "fail safe" capability.

Excessive particulate contents at either inlet or outlet of blower 46—shut down blower, provide diagnostics.

Where intention is to operate at negative pressure—pressure excessively low (with risk to structure) or not low enough (risking leakage of particulates). If not low enough, interrupt flow into the enclosure, also check blower, filter(s) cyclone fouling. If too low either stop blower or reduce blower speed.

Where positive pressure in enclosure 4 is allowed—pressure excessively high risking structural damage or leakage of particulates. Interrupt flow into enclosure, increase blower speed, check for fouling of filter(s) or fouling or filling of cyclone(s).

Fouling of filter(s)—stop operation of system.

Fouling or filling of cyclone(s) 38—stop operation of system.

Blower 46 temperature excessive—stop operation of system.

Blower 46 not operating or underspeed—stop operation of system.

Where seal 7 is a pneumatic seal—seal pressure out of allowable range—stop operation of system.

Where seal 7 is pneumatic or non-pneumatic—any one or more of seal position measurements (if sensors fitted) out of allowed range. (Or if pressure sealing pressure sensor(s) fitted, any one or more of their outputs out of range. Stop operation of system.

Block 211 represents the writing of sensor and other data to some form of storage. For example, the prototype system described below is provided with a facility to write data based on sensor outputs to an SD card for later downloading and checking. In that system, all active sensors are scanned cyclically once the system is in operation and derived outputs from them are time stamped using a real-time clock module and written to an SD card.

Block 213 represents communication of data to location(s) away from the worksite and receipt of instructions and/or the like from external sources. For example, where a service provider wishes to provide checking and certification of critical particulate removal operations from a location away from the site of the operation, it is possible to provide a communications interface for the transmission and receipt of data and instructions. As an example, a mine may have a wireless packet-switched digital data network covering its entire site that can be used to communicate with a base station, and that base station may communicate via the mobile phone network or via the internet by whatever other connection means is available. Where mobile phone network accessibility is available at a worksite, it may be used and the base station may not be necessary. The service provider may carry responsibility for correct functioning, calibration and the lie for the equipment used for particulate removal, and receipt of data from the various sensors described facilitates this function. Data and instructions may be transmitted substantially in real time or data may be written to memory (e.g. using an SD card) by system 199 for later transmission.

Note that although the above disclosure has referred to particulate removal, it is possible to use the apparatus as shown in FIGS. 1(a), 2 and 3 for purging of gases from enclosed spaces, either as an alternative to particulate removal or in any application where both particulates and undesired gas are both present. An online gas analysis device suited to the gas in question may be provided at for example any of stations F, G, H, I or K, instead of or in addition to a particulate concentration sensor.

Ways to arrange for the methods of FIGS. 1(a) and 1(b), and the operation of system 30 (including system 199) to be applied to other enclosures will now be described.

FIGS. 4 to 10 show one way in which a typical existing cabinet 60 for electrical components (not shown) can be modified to implement the invention using cleaning system 30, cabinet 60 corresponding to enclosure 4 in FIGS. 1 and 2. Cabinet 60, is a cabinet such as might typically be found in an industrial facility or in heavy mobile equipment such as a locomotive or mining haul truck, and has a fixed main portion 62 defining enclosed upper and lower spaces 64 and 66 respectively for electrical components. Cabinet 60 has been modified to enable cleaning of particulates using the invention, but only in respect of the upper space 64.

Closure of opening 68 of lower enclosed space 66 is provided by a conventional hinged door 70 normally held closed by a handle-operated latch 72. A peripheral elastomeric seal 74 mounted to main portion 62 extends around opening 68 to limit ingress of contaminants such as particulates when door 70 is closed.

Normally, cabinet 60 would have a hinged door essentially the same as door 70 except for its dimensions being suited to close opening 76 of upper space 64, and also a similar peripheral sealing arrangement. However, according to the modification, a rectangular frame 78 is secured (for example by welding at 81) to main portion 62 and extends peripherally around opening 76 of the upper space 64. A hinged door 80 is supported on frame 78 and can be opened to allow access to upper space 64 when required. Door 80 is received in frame 78 and held closed by handle-operated latches 82, and contaminant ingress and between door 80 and frame 78 is limited by a peripherally extending elastomeric seal 84. Because cleaning can involve temporarily increasing pressure in upper space 64, door 80 includes a reinforcing member 79 extending around its periphery.

Door 80 has features that enable the invention to be implemented for cleaning of upper space 64.

First, door 80 is provided with port assemblies 86 (corresponding to port assemblies 10) through any of which cleaning lance 12 can be pushed partway into upper space 64 at in the way shown for enclosure 4 in FIG. 1(a). Door 80 also has a transparent viewing window 88 corresponding to window 22 in FIG. 1(a).

Second, for removal of particulates from upper space 64, at least one outlet port 90 (corresponding to outlet port 18 in FIG. 1(a)) for gas and entrained particulates is provided in door 80. This has a removable cover 92 that can close outlet port 90 when cleaning is not underway. Duct 36 is secured to outlet port 90 for use when cleaning upper space 64. Outlet port 90 is provided in door 80, however in some embodiments (not shown) it may be provided (or an additional outlet port may be provided) at a suitable location in cabinet main portion 62.

In FIG. 6, one of port assemblies 86 is shown in exploded fashion. One or more discs 94 of gas impermeable elastomeric material (for example formed from an artificial or vulcanized natural rubber) are provided, each with a slit 96 extending across part of a diameter, and discs 94 are arranged in layered fashion with slits 96 oriented in different directions as shown. Discs 94 are secured against the door 80 by a ring 98 using fasteners (not shown) extending through holes 100 in ring 98 and door 80, ring 98 being concentric with a hole 102 in door 80. Port assemblies 86 can be reasonably (not absolutely) gas- and particulates-tight when not in use. Cleaning lance 12 can be pushed through slits 96 so that its nozzle 14 is inside the enclosure, while the gas supply hose 34 remains outside cabinet 60. Moreover, cleaning lance 12 can be rotated about its length as required, its angle to the door 80 varied, and the distance beyond door 80 to nozzle 14 can be varied by a user as required. The number of port assemblies 86 on door 80, and their positions, may in some embodiments be chosen to suit the arrangement of components within the enclosure 60 to enable most effective and thorough cleaning.

Note that the use of frame 78 as shown in FIGS. 4 to 10 is a measure that was adopted for the particular cabinet 60 described here, which had inadequate gas and particulates sealing around door 80. For a cabinet and door having adequate sealing arrangements (not shown) the door features described above may be able to be implemented by simply modifying the original door.

Figure 15:
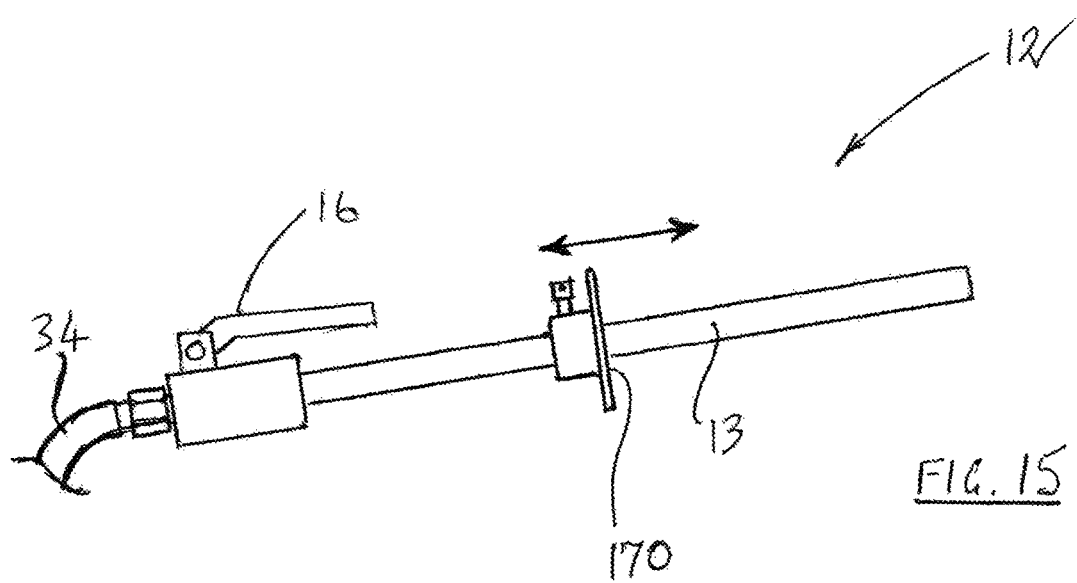

As shown in FIG. 15, the cleaning lance 12 may have a collar assembly 170 securable in any of a range of positions on tube 13 so as to prevent excessive penetration of cleaning lance 12 into the enclosure (for example cabinet 60, cabinet 150 or enclosure 4), leading to potential damaging of components therein.

Figure 11:
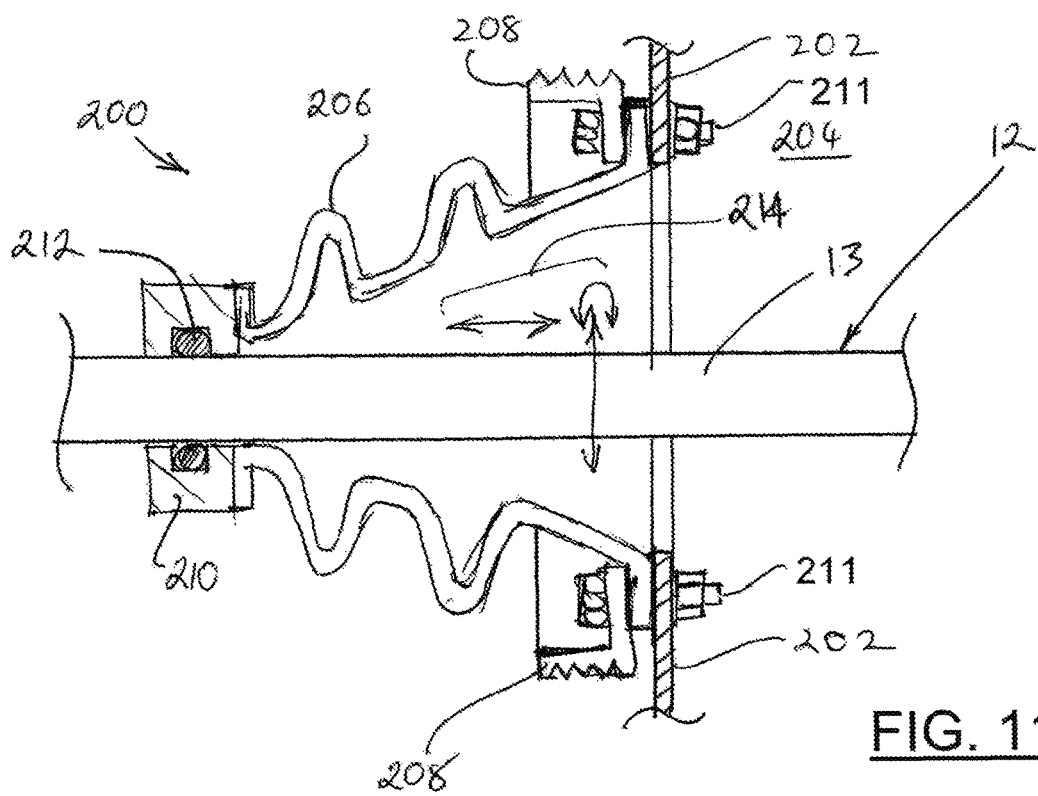
Figure 12:
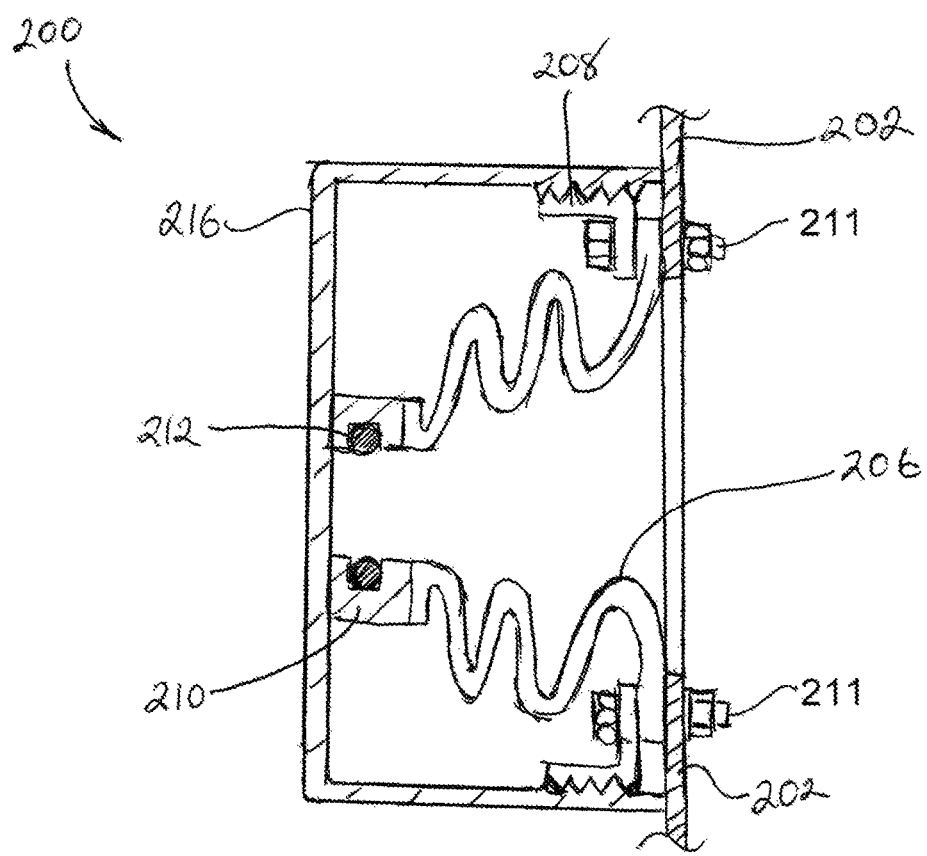

Alternatives to the port assemblies 10 shown in FIGS. 4 to 10 are possible. One such is shown in FIGS. 11 and 12. FIG. 11 shows a port assembly 200 secured to an enclosure door 202 (similar for example to door 80 or door 8) and providing access for cleaning lance 12 to an internal space 204. Port assembly 200 comprises an elastomeric bellows or boot 206, secured to door 202 by a ring 208 and fasteners 211. Secured to bellows 206 is a block 210 through which, in use, tube 13 of cleaning lance 12 can pass. Tube 13 can slide lengthwise in, and rotate relative to, block 210, and be angled in horizontal and vertical planes as shown by arrows 214, and sealing between tube 13 and block 210 is provided by an elastomeric O-ring seal. Other seal arrangements may be used depending on the application (e.g. lip seals, multiple seals). When port assembly 200 is not in use, a lid 216 is screwed onto a threaded portion of ring 208, after withdrawal of tube 13, to prevent gas and particulates egress. (Note that a lid (not shown) equivalent in function to lid 216 could be screwed to block 210 instead of ring 208.) Port assembly 200 requires that any nozzle 14 comprised in cleaning lance 12 be of lesser diameter than tube 13, so that tube 13 can be entered through block 210.

Further alternatives to the arrangements that were described above by reference to FIGS. 4 to 10 will now be described.

FIGS. 4 to 10 showed a permanent modification to an existing cabinet 60 to implement the invention, in which a frame 78 was secured to a main portion 62 of the cabinet 60, the frame 78 itself incorporating a door 80. Another approach applicable to cleaning of cabinets with hinged doors will now be described. This is to provide a temporary cover which can be secured sealingly over the opening of the cabinet after either removing or swinging open the cabinet's existing door.

Figure 9:
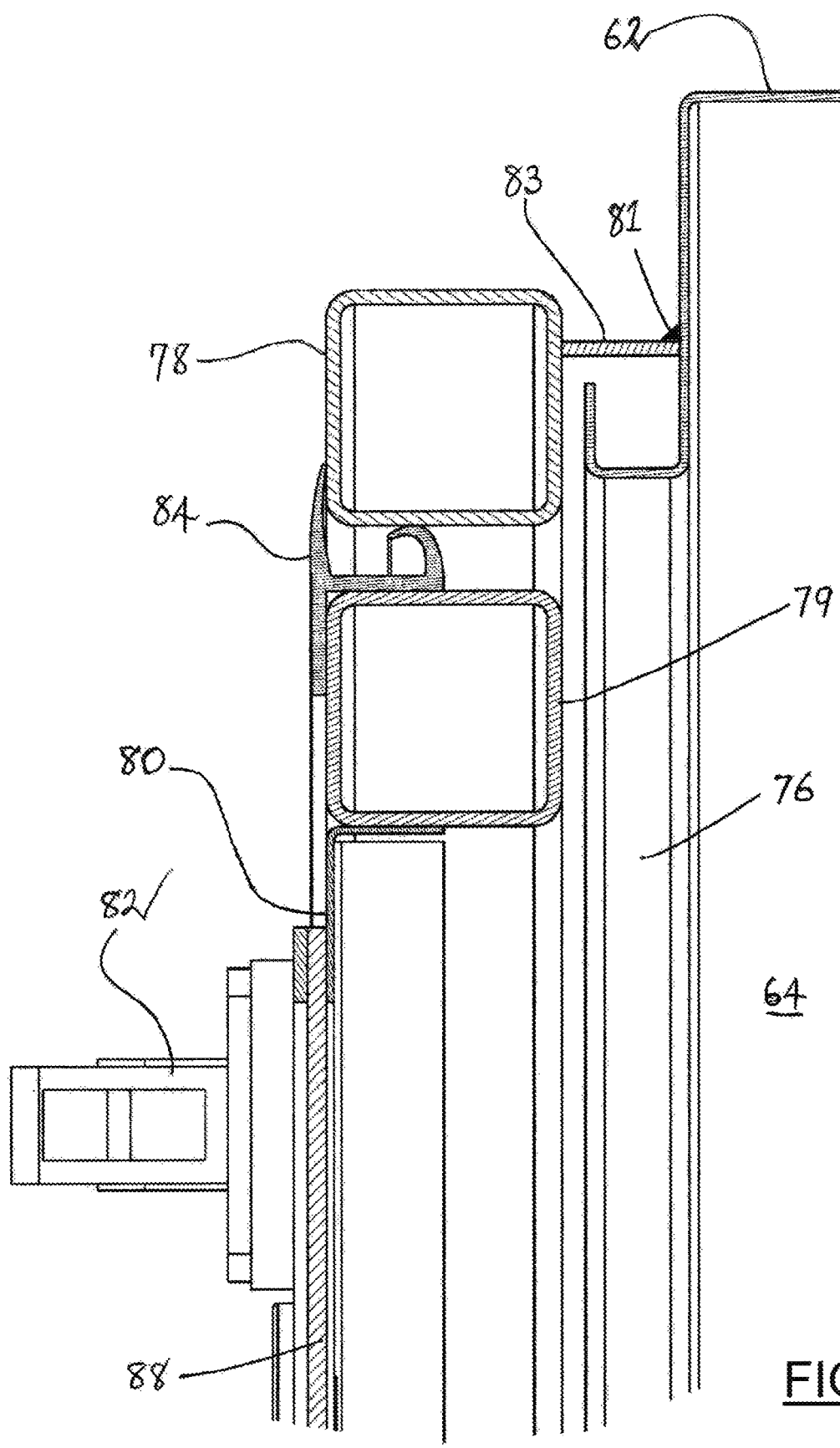
Figure 10:
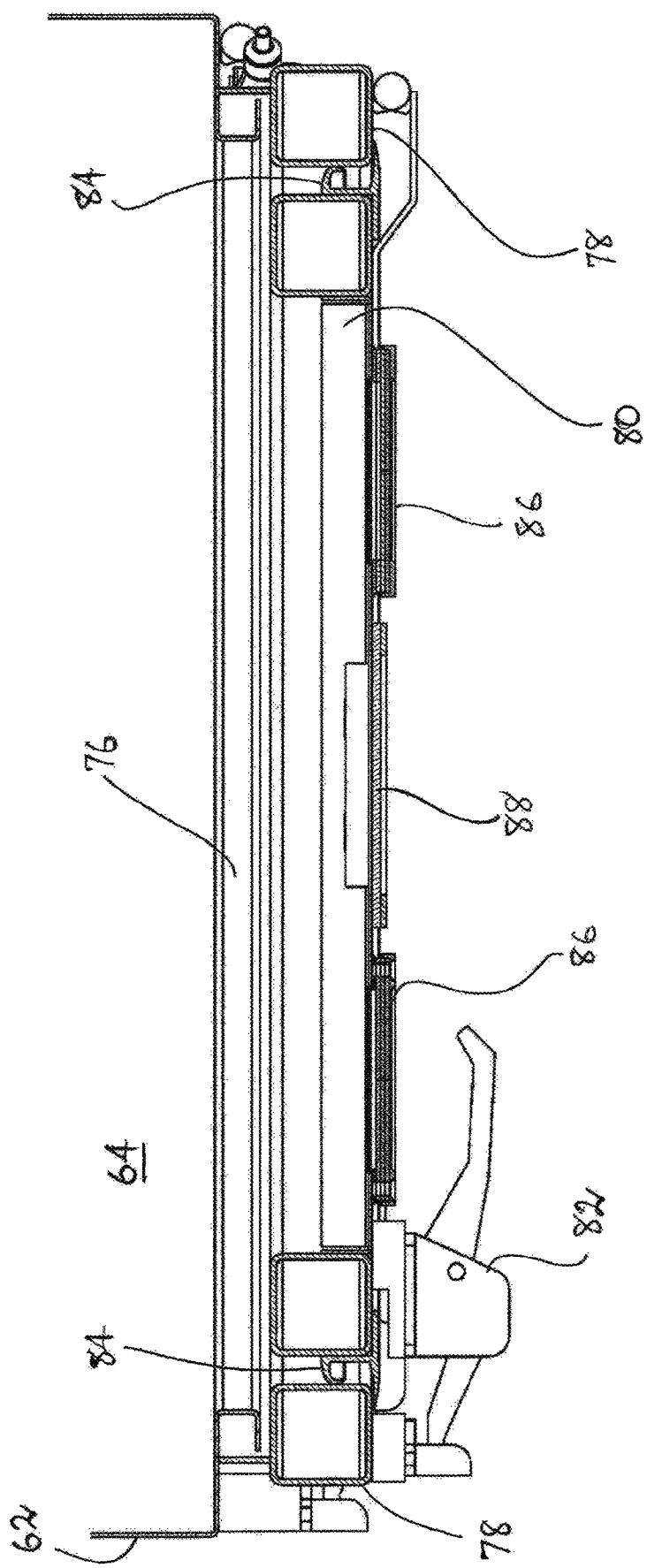
Figure 13:
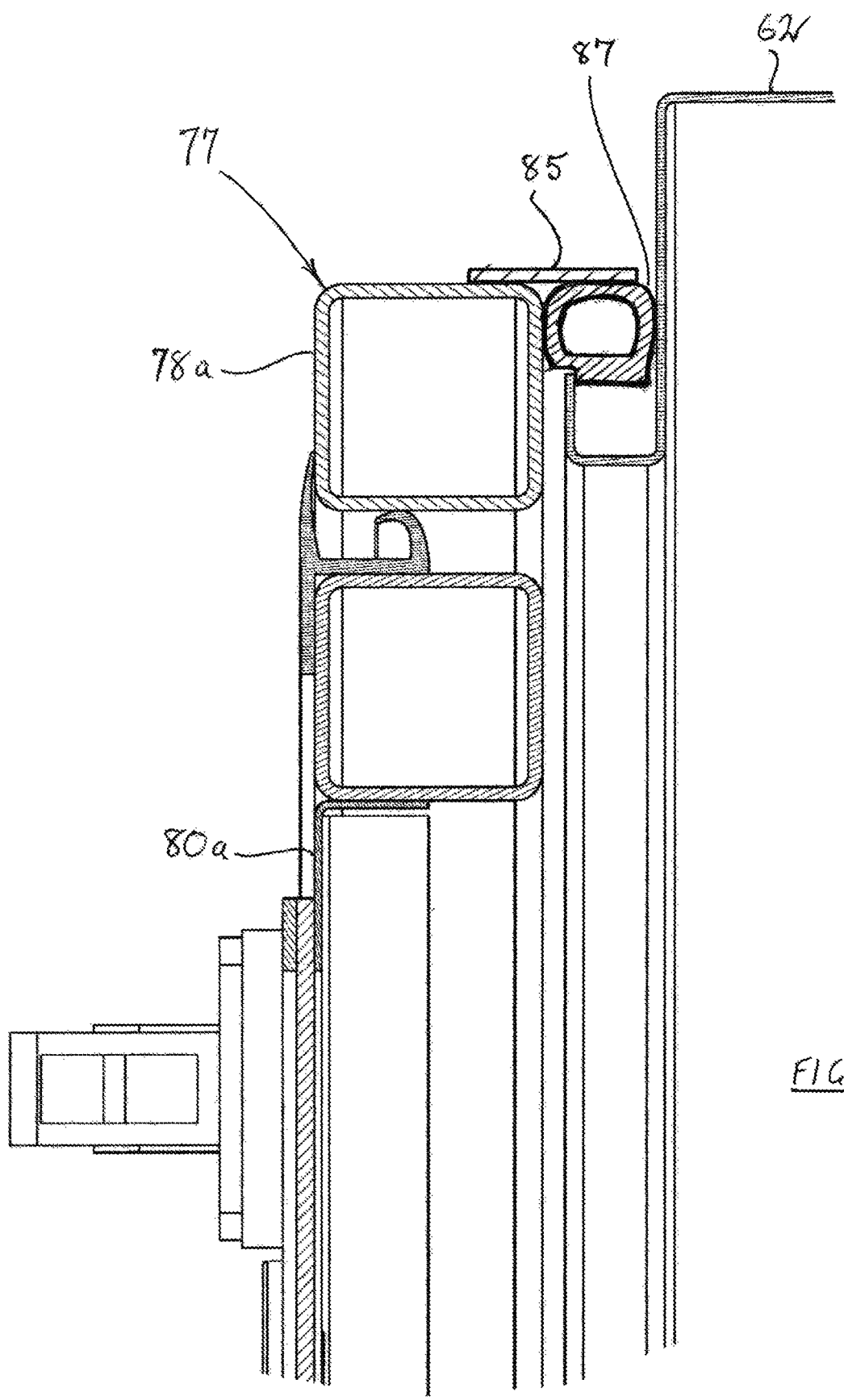

FIG. 13 shows in a view equivalent to FIG. 9 a temporary cover 77 comprising a frame 78a that is exactly the same as frame 78 in all respects, including provision of a door 80a equivalent to door 80, except that frame 78a lacks a member equivalent to member 83 (see FIG. 9) secured to cabinet portion 62 at 81. Instead, a retaining member extending peripherally around frame 78a is provided together with an elastomeric seal 87, also extending peripherally around frame 78a. When particulates are to be dislodged by use of cleaning lance 12, cover 78a is temporarily secured to cabinet main portion 62, being held in place by suitable clamps (not shown), the original door (not shown) of cabinet 60 being swung aside or removed altogether. Seal 87 may be inflatable with a gas to enhance its sealing action. When cleaning is complete, frame 78a is removed.

Figure 14:
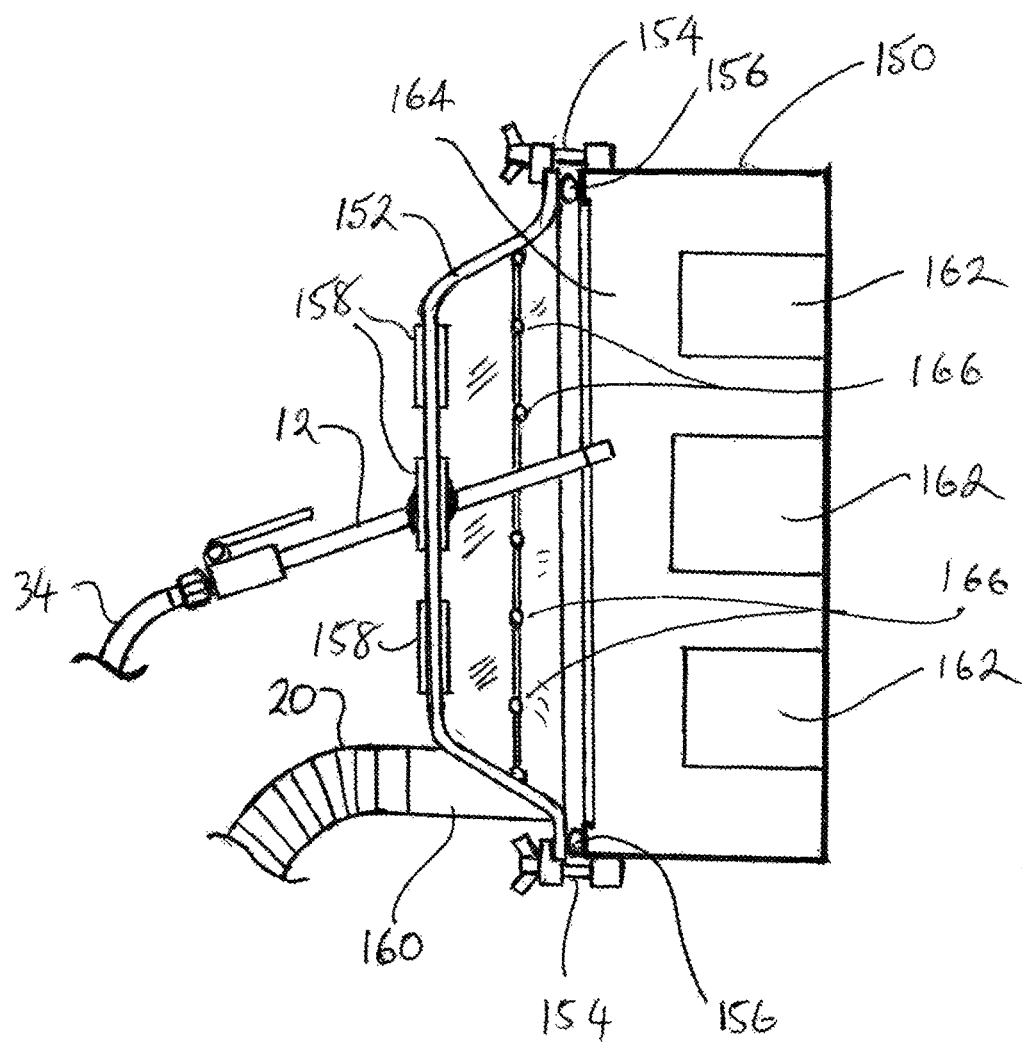

FIG. 14 shows a view (in vertical section) of a cabinet 150 fitted with an alternative temporary cover 152 for cleaning. Cover 152 is secured by suitable clamps 154 on its periphery. Cover 152 is sealed against cabinet 150 by a peripheral seal 156. This may if desired be of a type inflatable by gas. Cover 152 has port assemblies 158 which may be the same as port assemblies 10 and a gas-and-particulates outlet port 160 for connection of duct 20. Cover 152 has a dished shape (as seen in the section of FIG. 14) to provide more room between the port assemblies 158 and components 162 in cabinet 150 than would be provided by for example cover 78a. Where practicable, this shape can be advantageous in enabling easier and better positioning of cleaning lance 12 and reduced risk of contact with and damage to components in cabinet 150. Further, cover 152 is formed from a substantially transparent plastics material (e.g. polycarbonate or acrylic) to provide for easy visibility of the cabinet interior while cleaning lance 12 is in use. Anti-scratch treatments are known in the art and may be applied to at least the inward surface of cover 152. Still further, a set of light-emitting components (e.g. LEDs) is provided inside the space 164 formed by cabinet 150 and cover 152 to enhance visibility within space 164. (This approach to lighting is applicable also to other embodiments, such as those shown in FIGS. 4 to 10 and 13.) Cover 152 is shown without a door equivalent to door 80*a* of cover 77 but a hinged door could be provided in cover 77 if desired (not shown).

Figure 16:
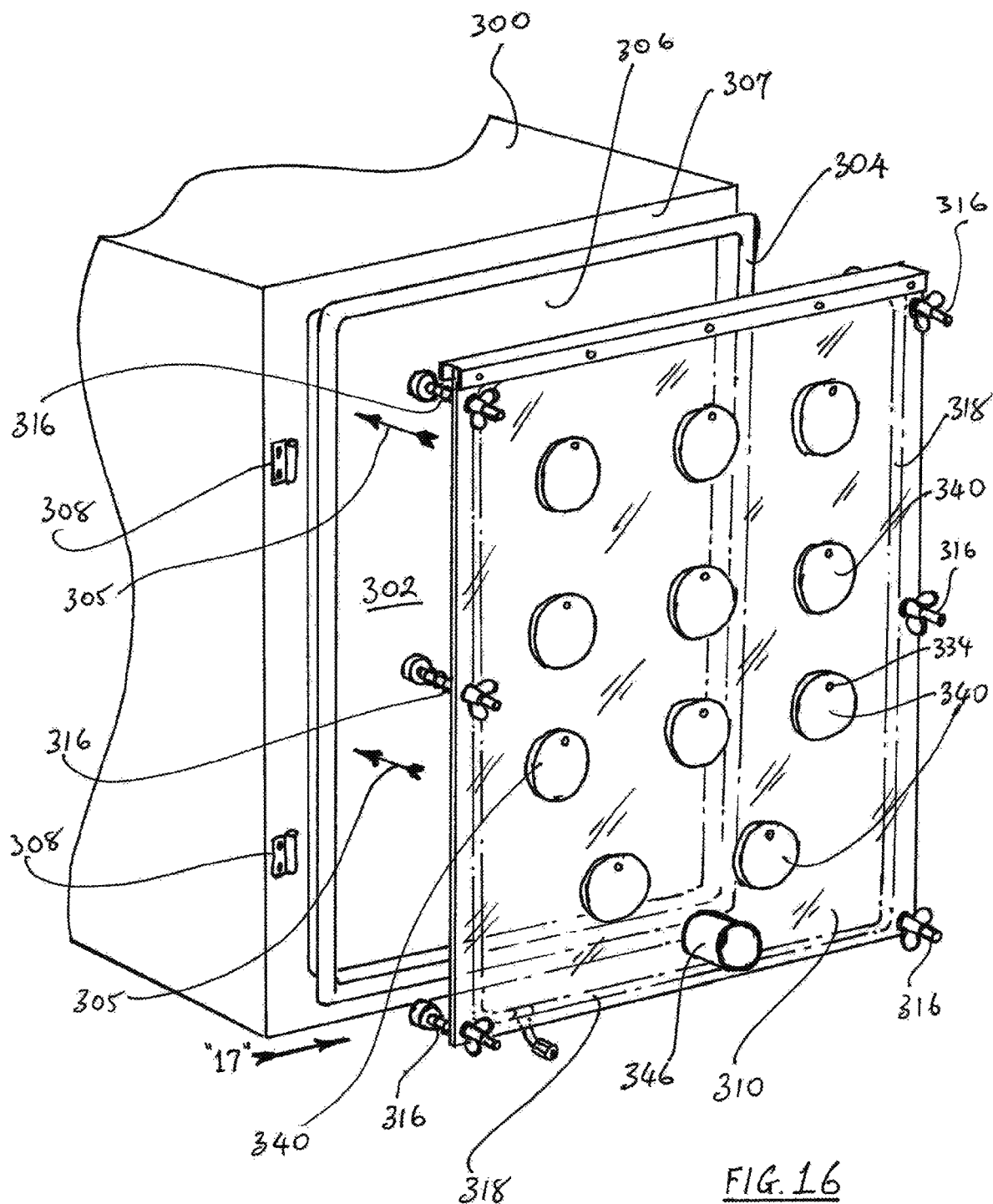

FIG. 16 shows still another temporary cover 310 that is an alternative to those described above. A cabinet 300 whose internal space 302 is to be cleaned of particulates. Cabinet 300 has a flange 304 surrounding an opening 306 that in ordinary use of cabinet 300 would be closed by a door or other cover. (No such door or cover is shown in FIG. 16.) Hinges 308 could for example support such a door that either is simply swung open or removed from cabinet 300. To cover opening 306, cover 310 is provided.

Cover 310 has a formation 312 on its upper edge 314 that can be hooked over an upper part of flange 304 when cover 310 is moved in the direction of arrows 305 towards flange 304. Cover 310 is then held in position over opening 306 by clamps 316. Extending around the periphery of cover 310 is a seal 318 that in use of cover 310 bears sealingly against flange 304 to prevent or limit passage of particulates from internal space 302 during cleaning (similarly to seal 84 of FIG. 8). Seal 318 is of rubber or a rubber-like material and may optionally be of a pneumatic type inflated with a gas. (A seal (not shown) serving the same purpose as seal 318 may, in alternative embodiments, be provided on an enclosure being cleaned for use with a cover otherwise equivalent to cover 310. Further, such a cover or a cover with a seal such as cover 310 may instead of being hung from a flange (such as flange 304 in FIG. 16, be hung from a suitable temporary or permanent formation specifically provided.)

Figure 17:
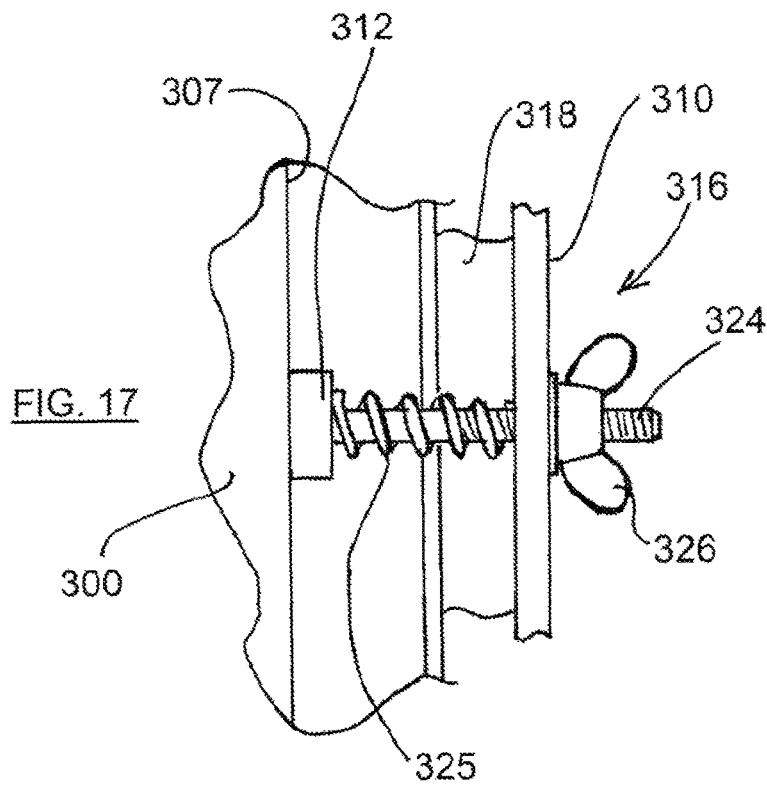

FIG. 17 shows one of the clamps 316. This has a magnet 322 that in use holds itself against surface 307 of cabinet 300, and captive thereon a bolt 324 passing through cover 310. A wingnut 326 can be screwed on bolt 324 to move cover 310 towards surface 320. Bolt 324 passes through a compression coil spring 325 between the magnet 322 and cover 310 to aid correct positioning of magnet 322 when cover 310 is being positioned ready for use.

Any other suitable clamp arrangement can be used as an alternative to clamps 316. In other embodiments, where control of pressure within an enclosure being cleaned is sufficiently reliable, to maintain a negative pressure within that enclosure at all times and dispense with some or all clamps such as clamps 316. The cover 310 is then held in place entirely or partially by atmospheric pressure due to the lesser pressure inside the enclosure. Another approach (not shown) as an alternative to clamps 316 is to provide magnetic tape to cover 310 extending around all or part of the periphery of cover 310 so as to be attracted to (for example) flange 304. Still another approach (not shown) is to provide discrete magnets recessed into cover 310 on its enclosure-facing side that are positioned to be abut flange 304 and be held by the magnets against it.

Figure 18:
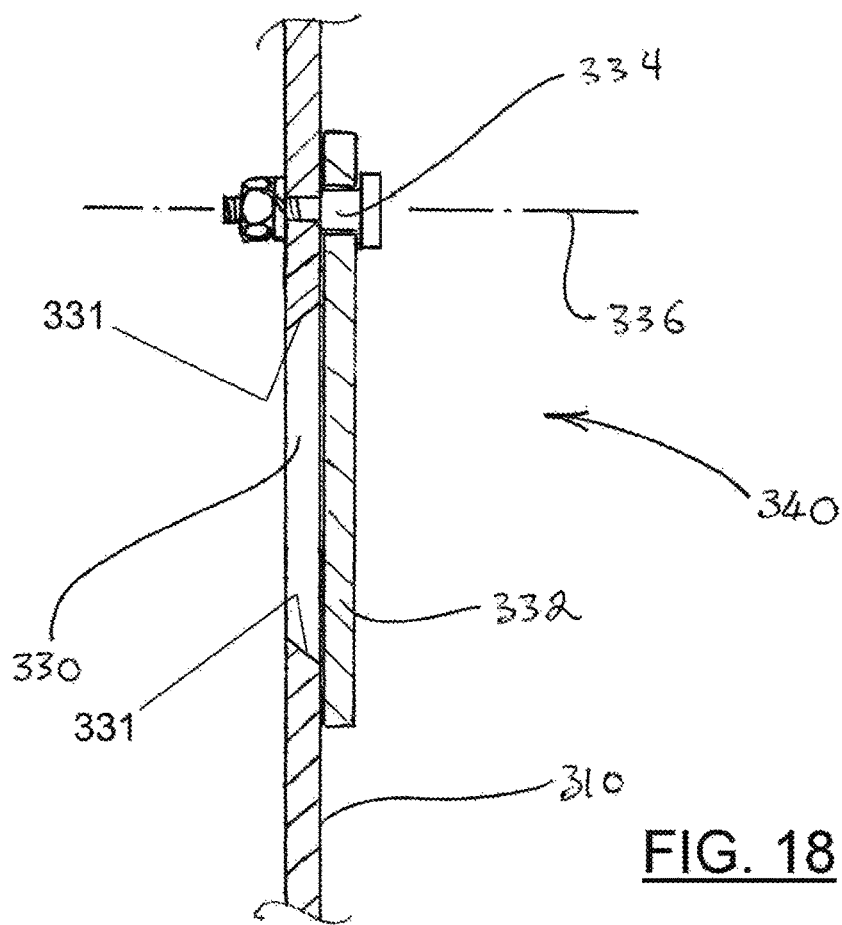
Figure 19:
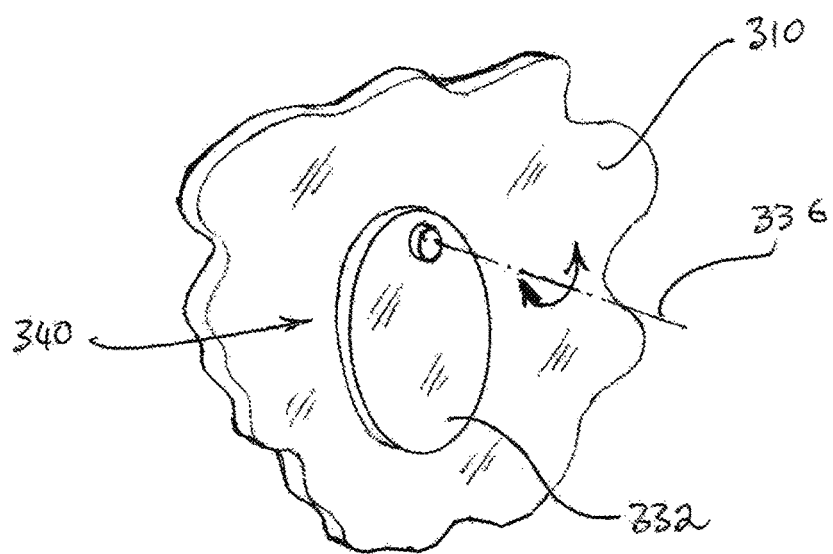

While port assemblies of the types described above (i.e. items 10, 200) may be used for cover 310 for insertion of a cleaning lance such as lance 12, cover 310 is shown with port assemblies 340 of a further type. Cover 310 has multiple openings 330 each covered (on the outer side of cover 310) by a movable cover 332, as shown in FIGS. 18 and 19. Movable cover 332 acts as a restriction to flow and possible particulate leakage through opening 330 when the port assembly 340 is not in use accommodating a lance 12. Openings 330 are bevelled at 331 to accommodate a range of angular movement of lance 12. Each cover 332 is supported on a pivot pin 334 so as to be freely swingable about an axis 336 by a user to uncover the associated opening 330. A cleaning lance such as cleaning lance 12 can then be inserted through the opening 330 in the same way as shown in FIG. 1(*a*) for use in blowing gas into internal space 302 to dislodge particulates therein. Thus, each combination of an opening 330, cover 332 and pivot pin 334 amounts to a port assembly 340 analogous to a port assembly 10. Port assemblies 340 are simpler than port assembles 10 and 200 and are suitable for use where it is intended that the internal space of a cabinet (or other enclosure) being cleaned will be held at a lower pressure than the surroundings of that cabinet enclosure. The low pressure at least limits any escape of particulates from the space 302 through port assemblies 340. Although not shown, it would be possible to provide a seal (for example an O-ring) surrounding opening 330 in either cover 332 or cover 310 to better seal cover 332 against cover 310 when the pressure is lower in the internal space than outside.

Cover 310 is shown as made from a sheet of transparent or at least translucent material, which is advantageous because a user has better visibility of what is happening inside the enclosure being cleaned. Suitable polycarbonate plastics materials can be used, for example, and may be treated with a scratch-resistant treatment as known in the art. Alternatively (not shown) a window (similar to window 88) may be provided, with cover 310 being otherwise non-transparent.

Cover 310 is shown with an outlet port 346 similar to outlet port 18 of FIG. 1(*a*), for connection of a duct (not shown) to be held at low pressure and receive gas and entrained particulates gas from the enclosure being cleaned.

FIG. 24 shows a cover 310*a* that is an alternative version of the cover 310 also positioned ready for securing to cabinet 300. Parts of cover 310*a* that are, and that function, the same as corresponding parts of cover 310 are indicated by item numbers including the suffix "a" and are not described again here. Cover 310*a* has several differences from cover 310, as follows. First, cover 310*a* comprises a central portion 311 and two side portions 313 and 315, that are hinged to central portion 311 by "piano"-type hinges 319 and 317 on the outward-facing side of cover 310*a*. This enables cover 310*a* to be folded, so as to be easier than cover 310 for one person to carry. (However, it is to be noted that hinges such as 317 and 319 preferably avoided where folding is not necessary as having no hinge is simpler.) Formation 312*a* is shorter than formation 312 of cover 310, extending only along a top edge of portion 311, to enable folding. Second, cover 310*a* has no attached seal corresponding to seal 318 of cover 310. Instead, a seal 321 is secured to, and extends around, flange 304. This may be either a pneumatic seal with an inflating connection 323, as shown, or a non-pneumatic elastomeric seal (not shown). To provide an adequate seal on cover 310*a* itself instead of flange 304, would be problematic due to the feature of folding. The chain-dotted outline 321*b* in FIG. 24 does not represent an actual component, but the area on cover 310*a* that is contacted by seal 321 when cover 310*a* is secured on cabinet 300. Note: cover 310*a* is shown with a different number and arrangement of port assemblies 340*a* from cover 310, but this is simply a matter of choice for any particular application.

While various embodiments of cabinet doors and enclosure covers have been described above, it is to be understood that particular features of any one may where practicable be combined with features of another. For example, LED lighting may be used in any of the designs described above, as may any of the port assemblies 10, 200 or 340 or the "dished" shape of cover 152.

Instead of a manually-manipulated and operated cleaning lance 12, some further embodiments provide for mechanical means for moving gas nozzle(s). Examples will now be given.

Figure 20:
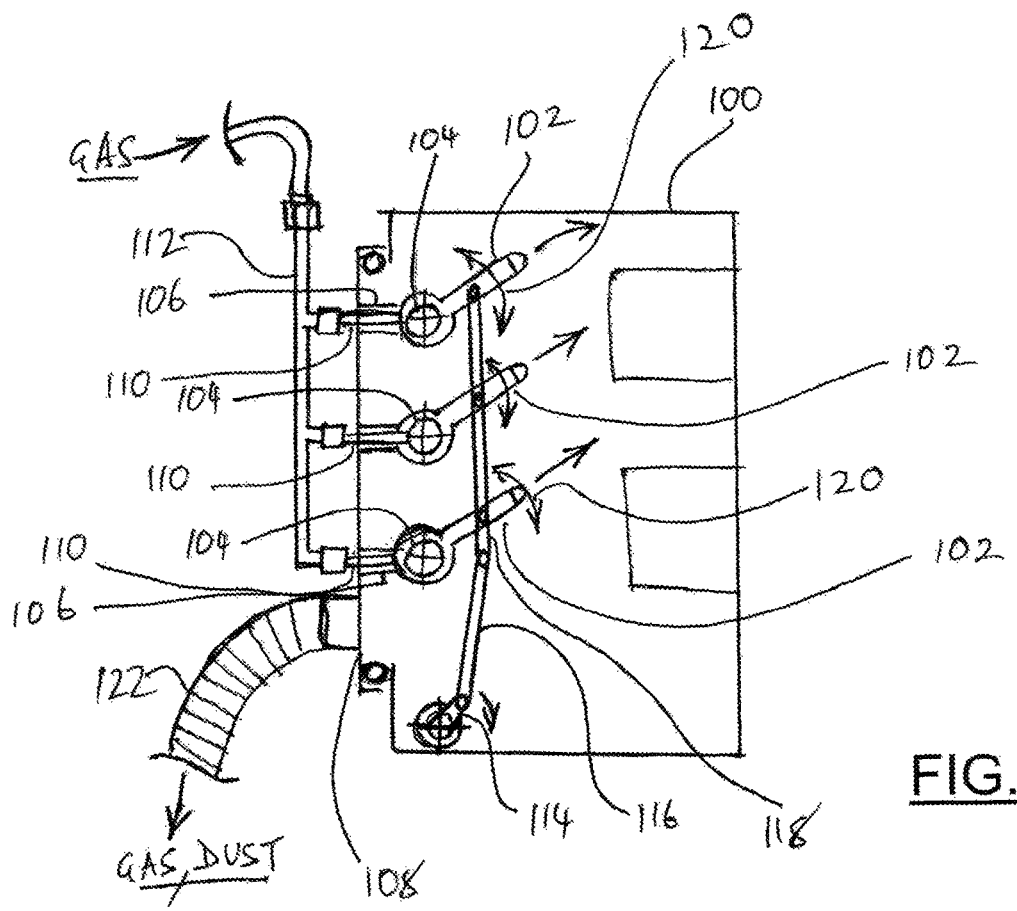

FIG. 20 shows an enclosure 100 in a view equivalent to FIG. 1(a). Nozzles 102 are mounted to, and able to rotate on, manifolds 104 that are in turn secured by brackets 106 to door 108. Manifolds 104 are supplied with gas from an external source (not shown) via conduits 110 that extend through door 108. Rotating seals (not shown) enable gas to flow from manifolds 104 into nozzles 102 even as nozzles 102 oscillate about manifolds 104. Conduits 106 are connected to an external manifold 112 on door 108. A rotating crank member 114 connects via a link 116 to a link 118 that can oscillate nozzles 102 about manifolds 104 through a range of angles as shown by arrows 120. Crank member 114 extends sealingly to the exterior of enclosure 100 and is rotated manually or by a motor (not shown). Gas with entrained particulates is drawn from enclosure 100 through a duct 122 equivalent to duct 20 of FIG. 2. There are several nozzles 102 on each manifold 104. Alternatively, an "air knife" type nozzle, not shown, elongate along the length of each manifold 104 may be provided instead of nozzles 102.

Figure 21:
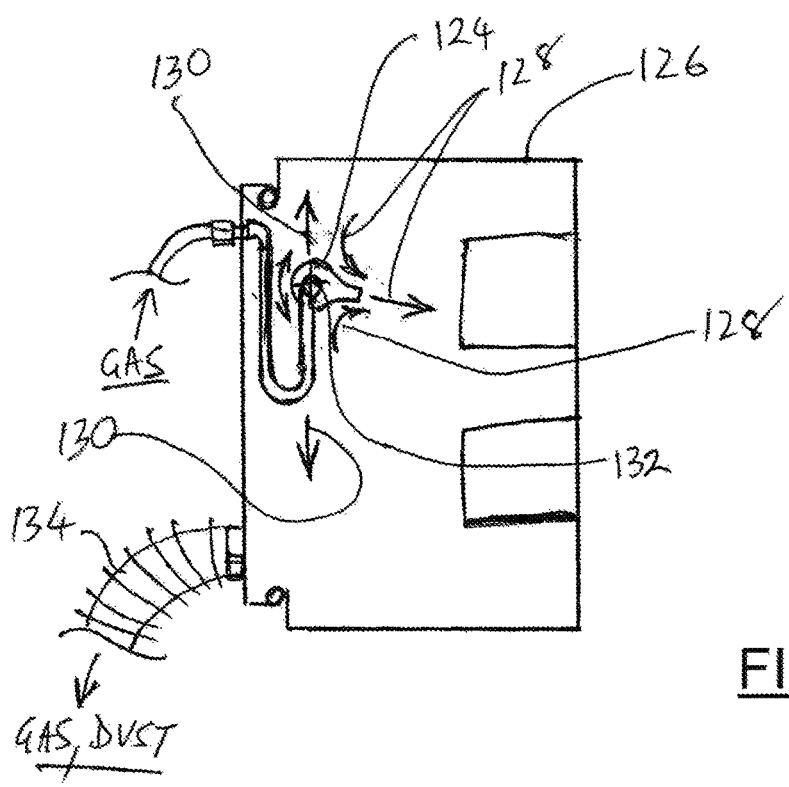

In a still further alternative shown in FIG. 21, a single "air knife" 124, so-called, that is elongate across the width of an enclosure 126 may be provided and arranged to be fed with gas from an external supply and to produce a flow of the type shown by arrows 128 in FIG. 21, with the air knife 124 being able to traverse up and down (as shown by arrows 130) and to oscillate around an axis 132 extending lengthwise of the air knife 124. A suitable mechanism (not shown) could readily be provided by a person skilled in the art and enable such motions to be provided. Duct 134 extracts gas and entrained particulates from enclosure 126.

In each of the arrangements shown in FIGS. 20 and 21, the system external to the enclosures 100 and 126 is the same as system 30 described above except for absence of cleaning lance 12. However, the arrangements shown in FIGS. 20 and 21 may even be provided with motorized and automatically controlled positioning of the nozzles (102 or air knife 124), and this may be under the control of microprocessor 200 or a separate microcontroller (not shown). Positions and orientations taken up may be chosen that are well suited to the specific components in the enclosure being cleaned, and their locations.

An embodiment will now be described that provides for cleaning of an open-top rail car (for example of the type used for transport of coal or other minerals) or the like, and that involves essentially the same principle as the embodiments described above. A problem with such rail cars is excessive particulates remaining in the car after emptying, these particulates later being disturbed when the empty car is in motion and so polluting the environment.

Figure 22:
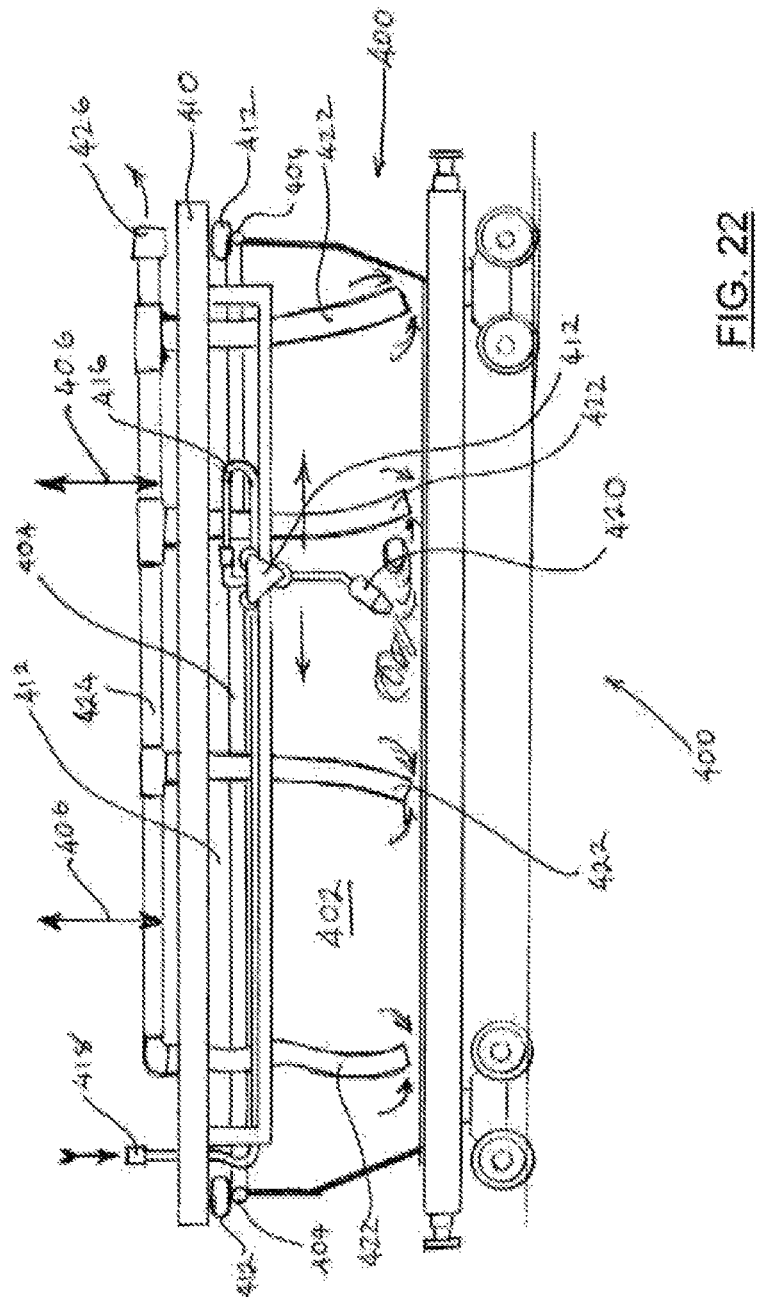

FIG. 22 shows a typical open top rail car 400 whose upper part, comprising a load containing space 402, is shown in longitudinal section. A tubular-section rail 404 extends around the top of the rail car. At a location where the car 400 is to be cleaned, a platform-like cover 410 is provided that when cleaning is to be carried out can be positioned over car 400 and lowered (in the direction of arrows 406) onto the rail 404 from above, whereby to close space 402. An elastomeric seal 412 contacts rail 404 after such lowering.

A carriage 412 moves lengthwise of the car 400 on a rail 414 (propelled for example by an air motor (not shown)) and has mounted thereon one or more nozzles 420 for blasting internal surfaces of space 402 with air (or other gas) supplied through a hose 416 and gas inlet 418.

To remove air (or gas) and entrained particulates from space 402, one or more ducts 422, of which four are shown, are provided on the underside of platform 410 and extend downward into space 402. Ducts 422 communicate with a manifold 424 from which air (or gas) and entrained particulates are drawn at 426 by a vacuum source (not shown). Internal space 402 may be kept during cleaning at a pressure below atmospheric.

When cleaning is complete, cover 410 is lifted upward to clear rail car 400. The arrangement shown in FIG. 22 may be used in a building (not shown) with ends through which cars 400 (or other vehicles where applicable) are sequentially driven with lifting of platform 410 effected by a fixed lifting equipment in the building. Alternatively, a truck or specialized vehicle (not shown) with a pivoted or articulated arm may be used to manipulate platform 400 and associated equipment as required for cleaning.

Figure 25:
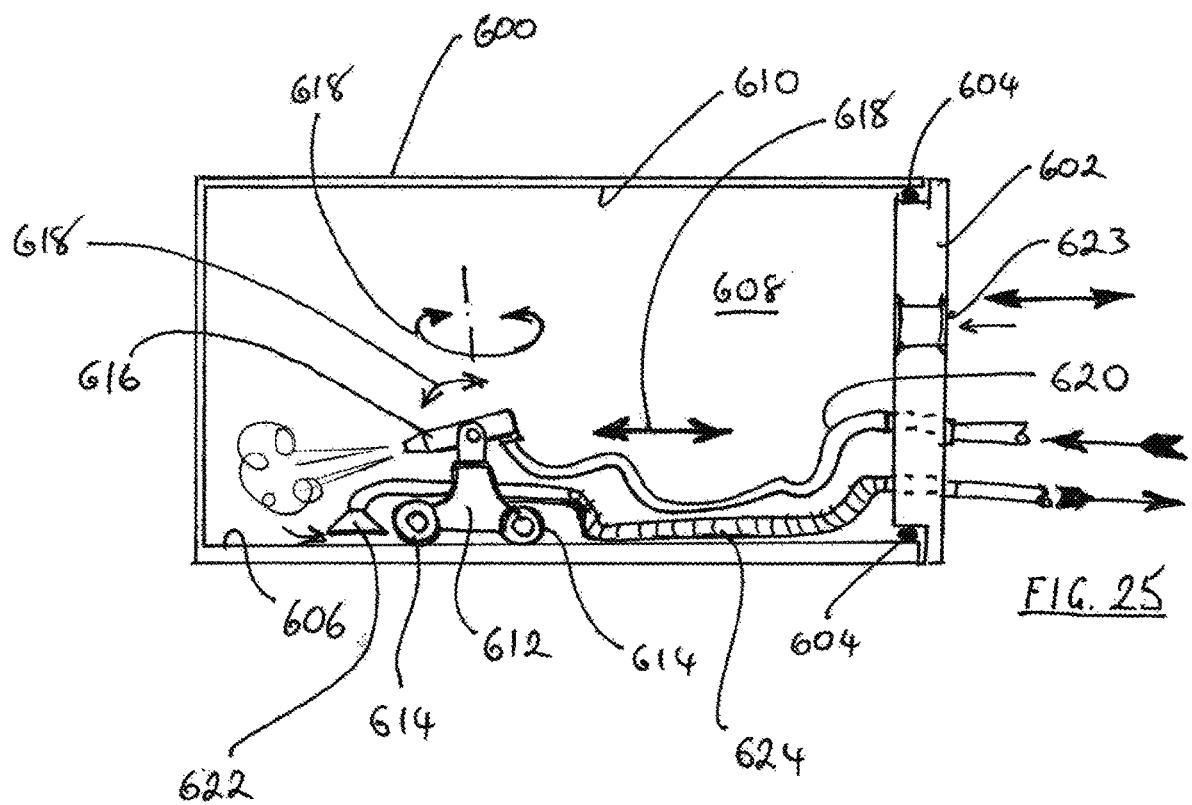
Figure 26:
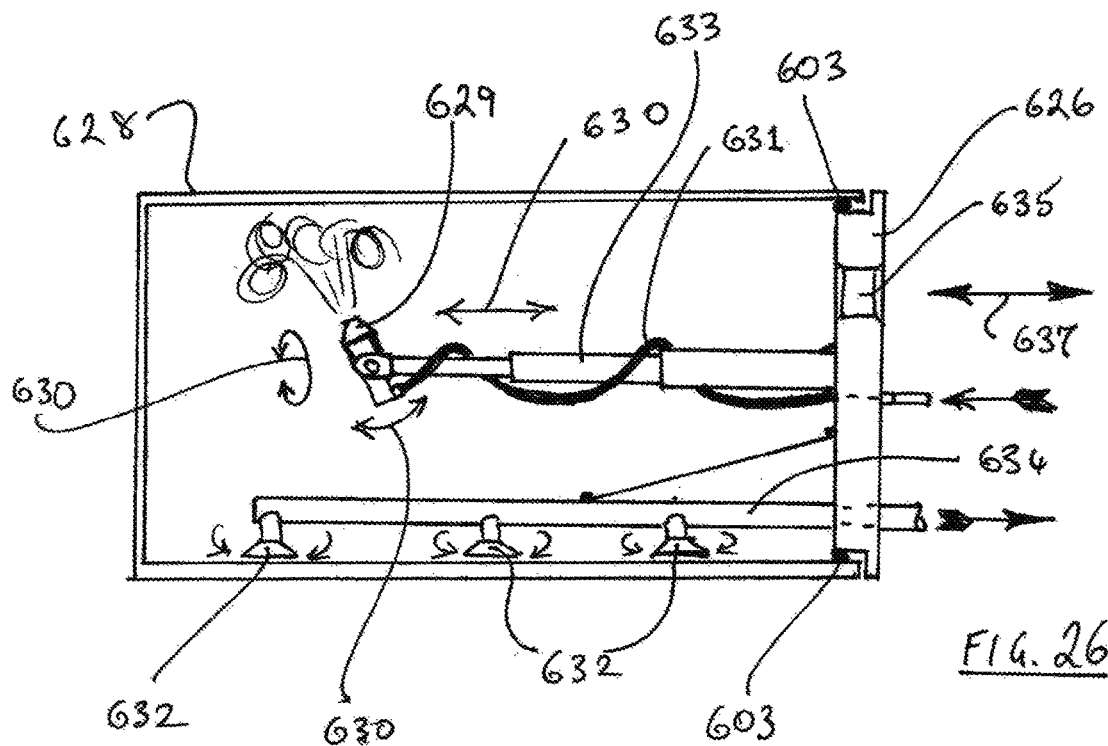
Figure 28:
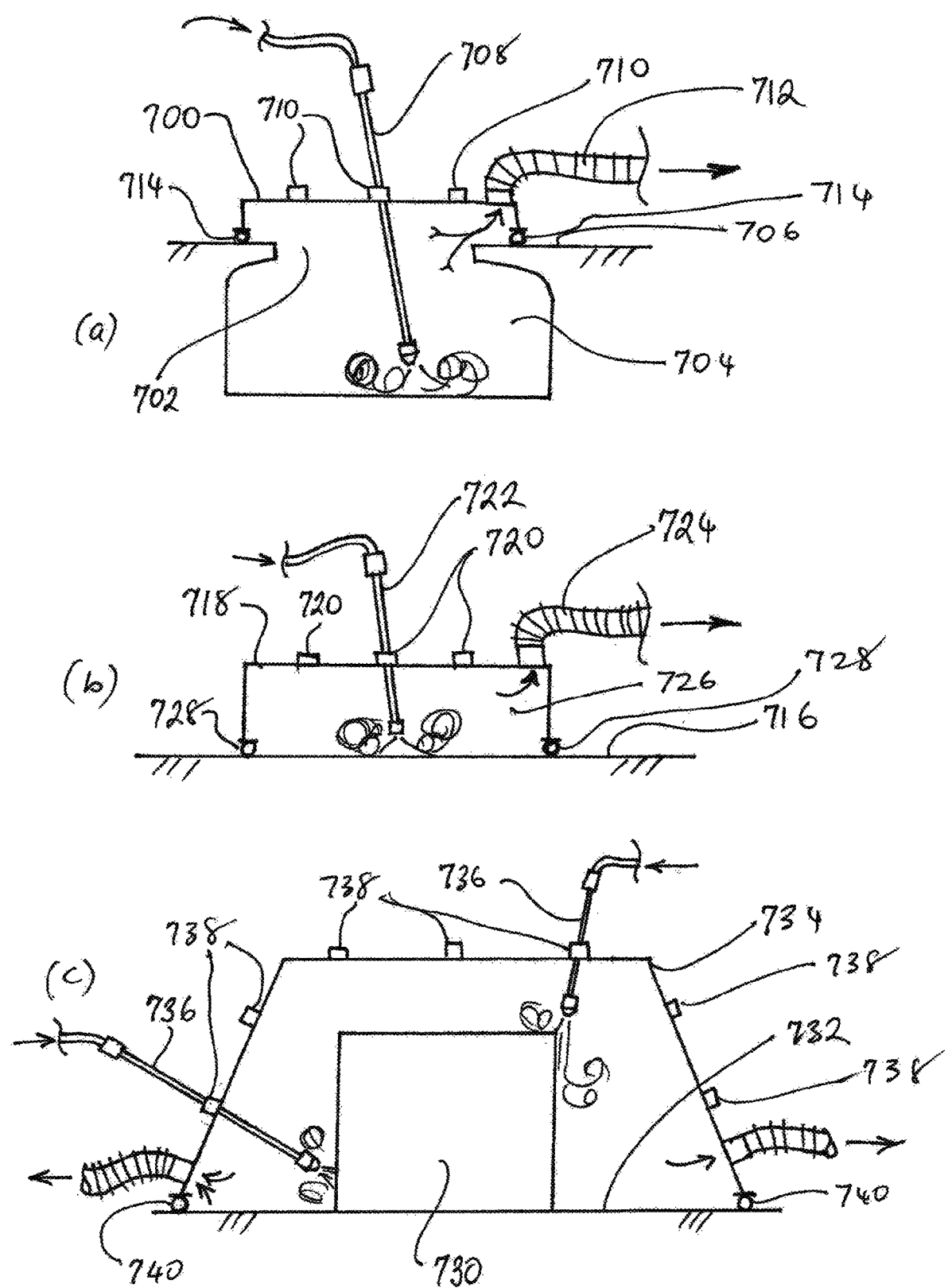

Other types of container or enclosure are not open-topped but rather open at an end. As an example, FIGS. 25 and 26 are longitudinal central sections on standard shipping containers. (Some detail of these containers has been omitted, including doors.)

In FIG. 25, container 600 is closed by a cover 602 that fits into its open end when the outward-opening doors (not shown) are opened. Cover 602 is sealed against gas and particulate movement by a peripheral seal 604 that extends wholly around cover 602 and seals against inner surfaces (floor 606, walls 608 and ceiling 610) of the container 600. Seal 604 may be a pneumatically inflated seal. Sealing is not against end surfaces of container 600 because of the presence thereon of latch fittings (not shown). In container 600 is a support carriage 612 movable under user remote control on wheels 614, and that has a gas nozzle 616 that can be remotely controlled by a user, outside container 600, to move in a range of ways, as indicated by arrows 618. Gas is supplied to nozzle 616 by a conduit 620 (including a hose portion) connected through cover 602 to a gas source (not shown) so that a jet of the gas can be used to dislodge and entrain particulates. Carriage 612 is also fitted with at least one inlet 622 for gas and entrained particulates, that in turn is connected via a flexible outlet duct 624 to a system (not shown) equivalent in function to system 30 of FIG. 2. A window 623 is provided in cover 602 so that the user (not shown) can see and guide the carriage 612 as required until the monitored concentration of particulates leaving the container 600 is sufficiently low. Suitable lifting and manipulation equipment (not shown) is provided for positioning carriage 612 and then cover 602 for use, and for subsequently removing them from container 600.

FIG. 26 shows an alternative arrangement in which a cover 626 is fitted into an end of a shipping container 628 in essentially the same way as cover 602 is fitted to container 600. A pneumatic or other suitable seal 603 equivalent to seal 604 is provided to prevent escape of gas and particulates around the periphery of cover 626. A nozzle 629 directs a jet of gas to dislodge and entrain particulates in the same way as nozzle 616 and is movable under user remote control in a range of ways as indicated by arrows 630. A gas supply (not shown) external to cover 626 is provided and supplies nozzle 629 through a hose 631. Nozzle 629 is supported in this embodiment by a structure 633 secured to cover 626. This is shown as a multi-section telescopic arm, but other arrangements will readily suggest themselves to persons skilled in the art. Exhaust inlets 632 are provided on a structure 634 that is also secured to cover 626 and that incorporates outlet ducting for gas and entrained particulates. A window 635 is provided in cover 626 for a user outside container 628. Not shown in FIGS. 28(*a*)-(*c*) is a system equivalent in function to system 30. Suitable manipulating equipment (not shown) is provided to enable cover 626 and the components secured to it to be entered longitudinally (i.e. in the direction of arrow 637) into container 628 and later removed.

Although standard shipping containers have been referred to in relation to FIGS. 25 and 26, other types of enclosures could be suitable for similar arrangements. For example, some road vehicles (not shown) have enclosures with end doors, and the arrangements shown in FIGS. 25 and 26 could apply to them.

Figure 27:
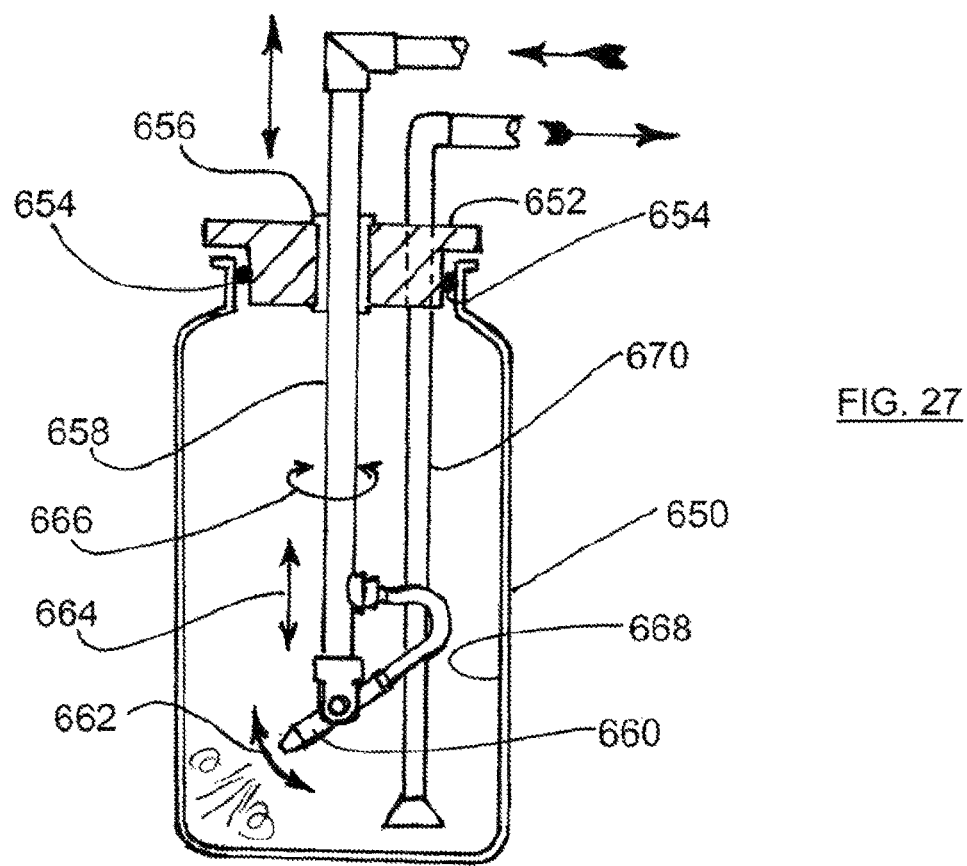

FIG. 27 shows a still further application similar to that described above by reference to FIG. 26. A container 650 (such as for example a plastics barrel of the type used for solid-phase chemicals) is temporarily closed by a cover 652 that is sealed to the container 650 by a suitable peripheral seal 654 (pneumatic or otherwise). Cover 652 has a gland 656 through which there passes sealingly a gas inlet duct 658 through which an external gas source (not shown) supplies gas to a nozzle 660 within container 650. Nozzle 660 is able to be moved angularly as shown by arrow 662, and the duct 658 is able to be both traversed up and down (as drawn) and rotated as shown by arrows 664 and 666 respectively. The movements of the nozzle 660 and duct 658 are controlled either by an automatic mechanism (not shown) or manually by a user whereby a jet of gas from nozzle 660 can be directed over the entire internal inner surface 668 of container 650. Also extending through the cover 652 into container 650 is an outlet duct 670 through which gas and entrained particulates are drawn out. Also provided is a system (not shown) equivalent to system 30, for providing gas to duct 658 and drawing out, treating and monitoring gas and articulates flowing through duct 670.

Figure 23:
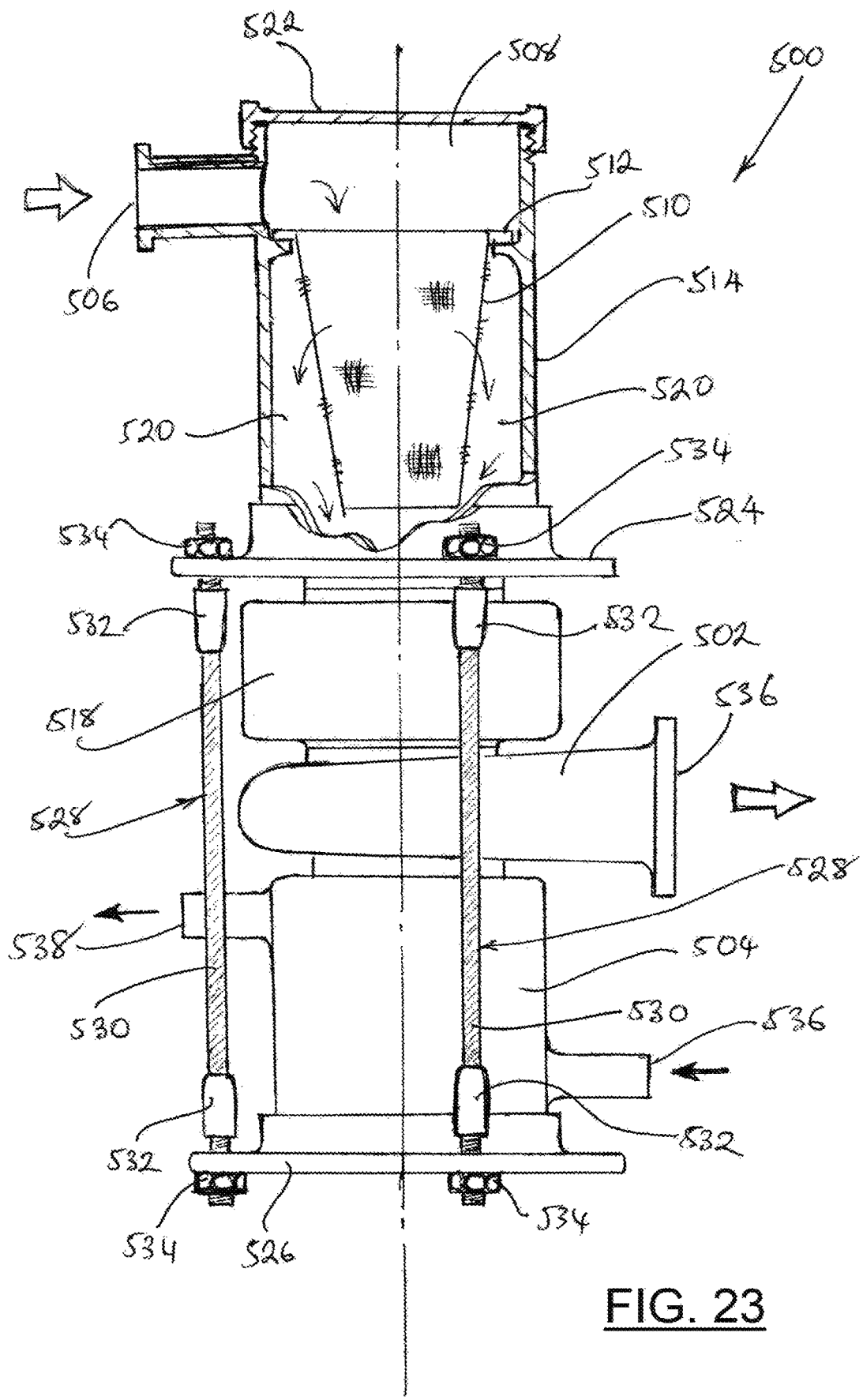
Figure 2A:
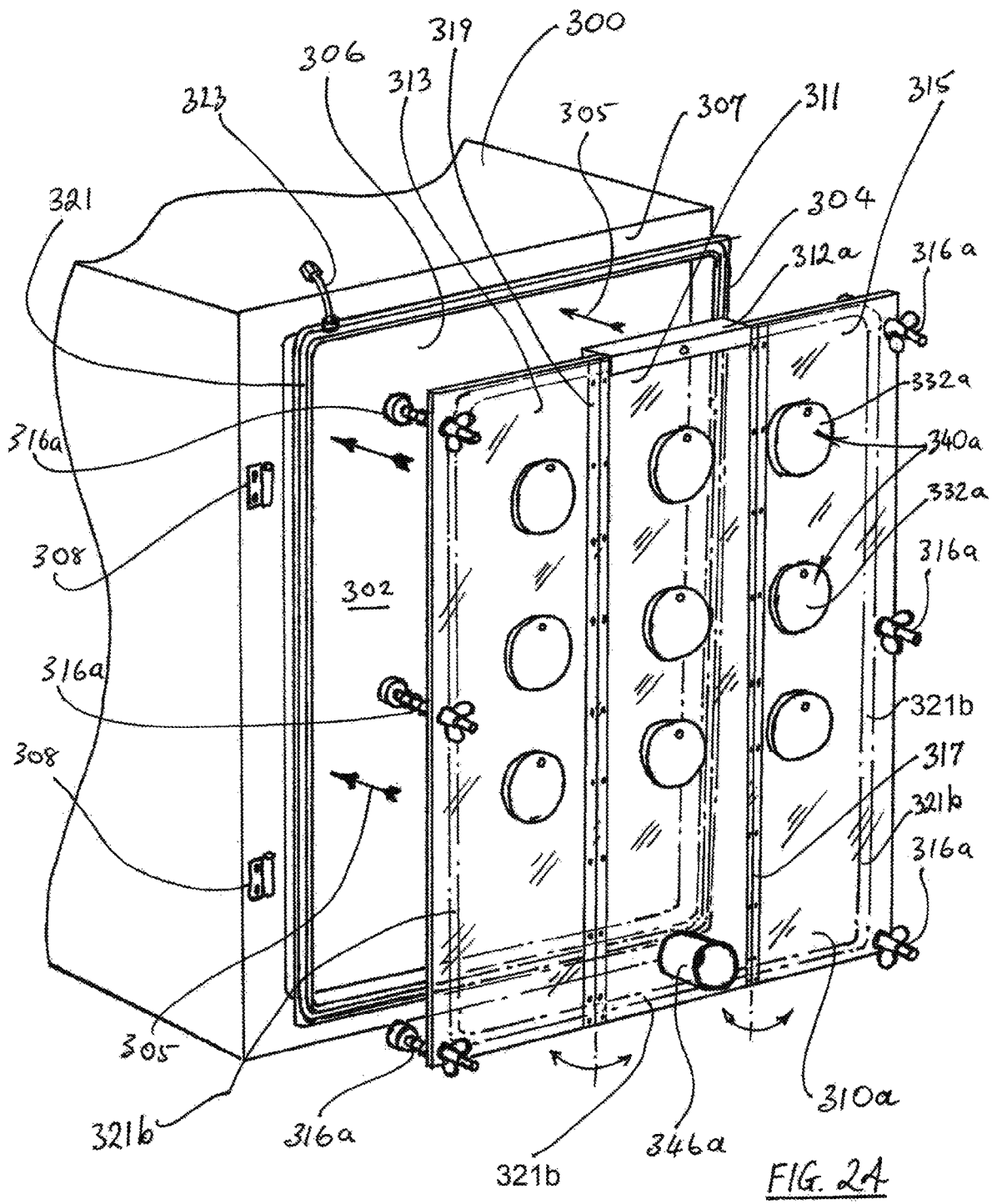

FIG. 23 shows an assembly 500 usable in some embodiments of the system 30 shown in FIG. 2, specifically comprising elements 40, 42 and 46. Assembly 500 comprises a firstly centrifugal fan (blower) 502 corresponding to blower 46 in system 30. Fan 502 is coupled to and driven by a shaft (not visible) of an electric motor 504. Gas enters assembly 500 through an inlet port 506 after leaving cyclone separator 38 and so contains less particulates than at outlet 18. From inlet port 506 the gas enters a plenum chamber 508 and then passes through a filter bag 510 that is supported by a ring 512 at its upper end in a cylindrical casing 514 which is shown partially sectioned. Filter bag 510 corresponds to filter 40 of system 30 and may comprise a woven textile or unwoven material (as known in the filter art) suitable for catching particulates while the gas passes through it and into an outer space 520 of casing 514. From space 520, the gas then enters a modular HEPA filter 518 (corresponding to element 42 in FIG. 2)), thereafter passing into fan 502 and out through outlet 536 (corresponding to outlet 53 of system 30). Casing 514 may advantageously be formed from a transparent plastics material so that any fouling of space 520 by particulates becomes apparent to a user.

Removal of filter bag 510 for emptying or disposal can be effected through a lid 522 at the top (as drawn) of the plenum chamber 508. Bag 510 is preferably of conical shape and proportioned to at least approximately equalize along its length the flux of gas through its surface.

To hold the parts of assembly 500 together securely and sealingly against gas and particulates leakage and enable easy disassembly when required, casing 514 is fitted with a flanged ring 524 and a base plate or ring 526 is provided at an end of motor 504. Spaced circumferentially around and extending between and through ring 524 and plate (or ring) 526 are several (for example three) tension members 528 which once placed in tension hold together the fan 502 and motor 504, HEPA filter 518, and casing 514. Members 528 may be for example solid rods threaded at each end for nuts or (as shown) lengths 530 of wire rope with threaded end fittings 532 swaged on at each end and secured by nuts 534.

Motor 504 has its own integral air pump (not shown) for cooling with inlet 536 and outlet 538 separate from the gas flow circuit of system 30.

Assembly 500 is convenient for some embodiments and applications, including where components of system 30 are provided in a backpack (not shown).

Yet another cover 310*c*, shown in FIG. 29 and similar to cover 310*a* (shown in FIG. 24) will now be described. Cover 310*c* has a number of features that differ from features present in cover 310*a*. Parts of cover 310*c* that are, and that function in essentially the same as corresponding parts of cover 310*a* are indicated in FIG. 29 by item numbers that are the same as those corresponding parts with an added suffix "c" so as to not need further explanation. Thus for example items 312*ac* in FIG. 29 do for cover 310*c* what items 312*a* do for cover 310*a*, namely allow cover 310*c* to be hooked over an upper part of a flange of a cabinet (not shown).

Instead of being made in three panels 313, 315 and 311 connected by two hinges, cover 310*c* has two panels 802 and 804 connected by a single hinge 806. (Of course, hinge 806 may be omitted altogether where foldability is not required.) Panels 802 and 804 are flat and may be of a suitable translucent or transparent sheet plastics material. Port assemblies 340*ac* are provided, but in different locations from the port assemblies 340*a* of cover 310*a* that facilitate folding of the two panels 802 and 804 flat against each other when cover 310*c* is not in use. Not shown, but another possibility, is to provide port assemblies 340*ac* in locations tailored to allow best access to items (not shown) in enclosures on which cover 310*c* will in use be deployed.

FIG. 30 shows a particular port assembly 808, comprising a cover portion 810 that threadably engages with a collar 812 secured gas-sealingly to panel 802. Cover portion 810 can be screwed into or out of collar 812 as required using handle formations 816 and has an opening 814 that allows a lance (such as lance 12) to be pushed into an enclosure (not shown) on which cover 310*c* is secured. The other port assemblies 340*ac* have collars (not shown) the same as collars 812 and cover portions 818 the same as cover portion 810 except that no opening corresponding to opening 814 is provided. These cover portions 818 have annular elastomeric seals (not shown) the same as seal 820 of cover portion 810.

Instead of a single port for extraction of gas (like port 346*a* of cover 310*a*) cover 310*c* has two ports 821 and 822 that are in fluid communication with chambers 823 and 824 on the sides of panels 802 and 804 respectively that in use of cover 310*c* lie in the opening of an enclosure (not shown) to be cleaned. Chambers 823 and 824 have internal spaces 825 and 826 respectively. (Chambers 823 and 824 are shown in FIG. 29 as they would be seen through transparent panels 802 and 804.)

Figure 31:
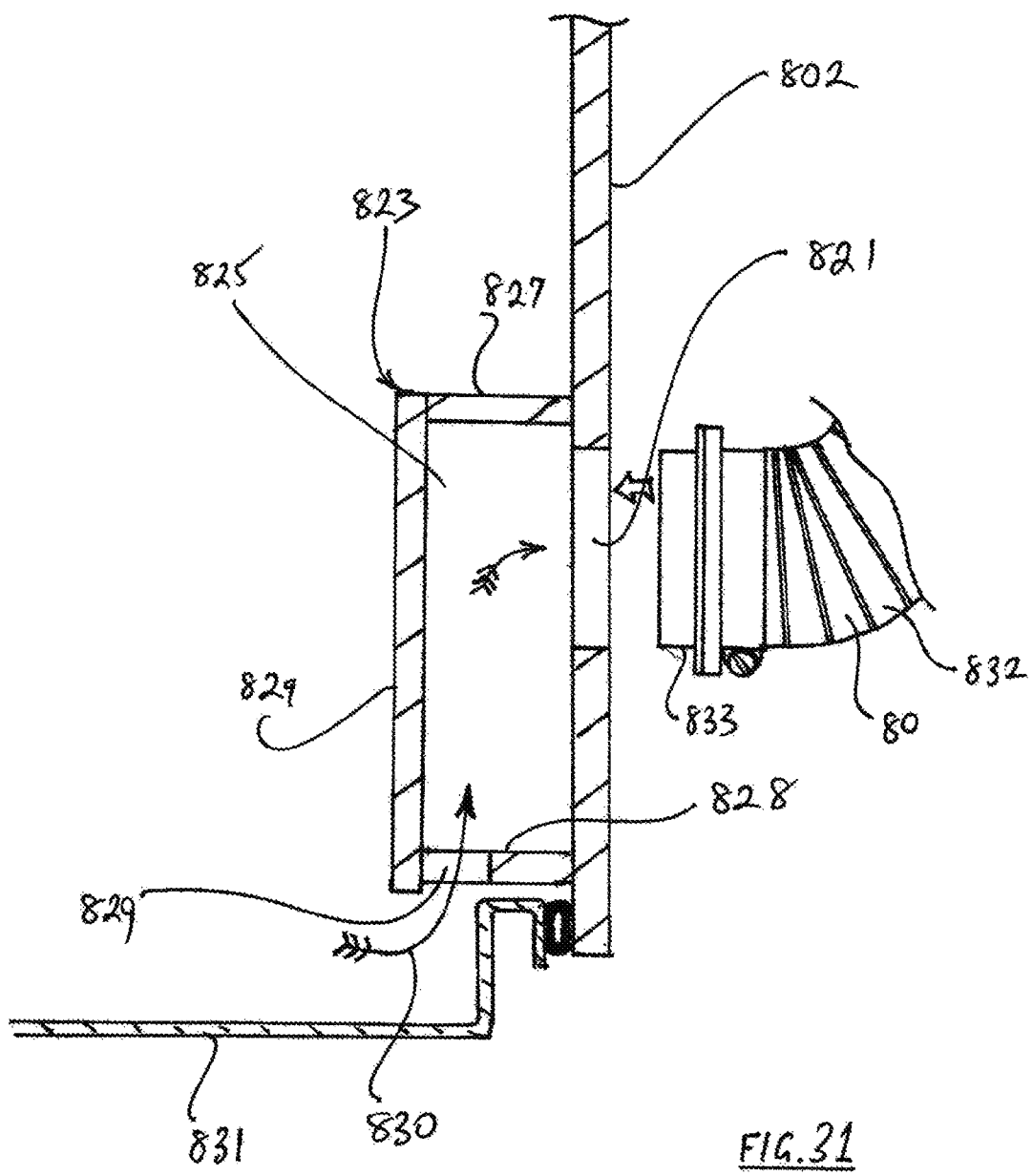
FIG. 31 is a partial cross-section taken at station "31-31" in FIG. 29.

Chamber 823 (the same as chamber 823) is shown in section in FIG. 31. Space 825 is defined by walls 827, 828 and 829. Wall 828 has elongate slots 829, so that entry of gas and entrained matter is through multiple slots 829 as shown by arrow 830. This arrangement provides for better removal of entrained matter than a single position port such as 346*a*. Item 831 is a portion of an enclosure to which cover 310*c* could be secured for use. Flexible duct 832 (corresponding to duct 20 of FIG. 1) is shown in FIG. 31 as positionable sealingly by an end fitting 833 enterable into port 821. Because there are tow ports 821 and 822, two such ducts are required and may be joined into a single flexible duct (not shown) by a suitable fitting. The essential here is that gas and entrained particulate matter can be collected at multiple points with an enclosure being cleaned.

Still further arrangements for effective removal of gas and entrained particulates will readily suggest themselves to persons skilled in the art.

Figure 32:
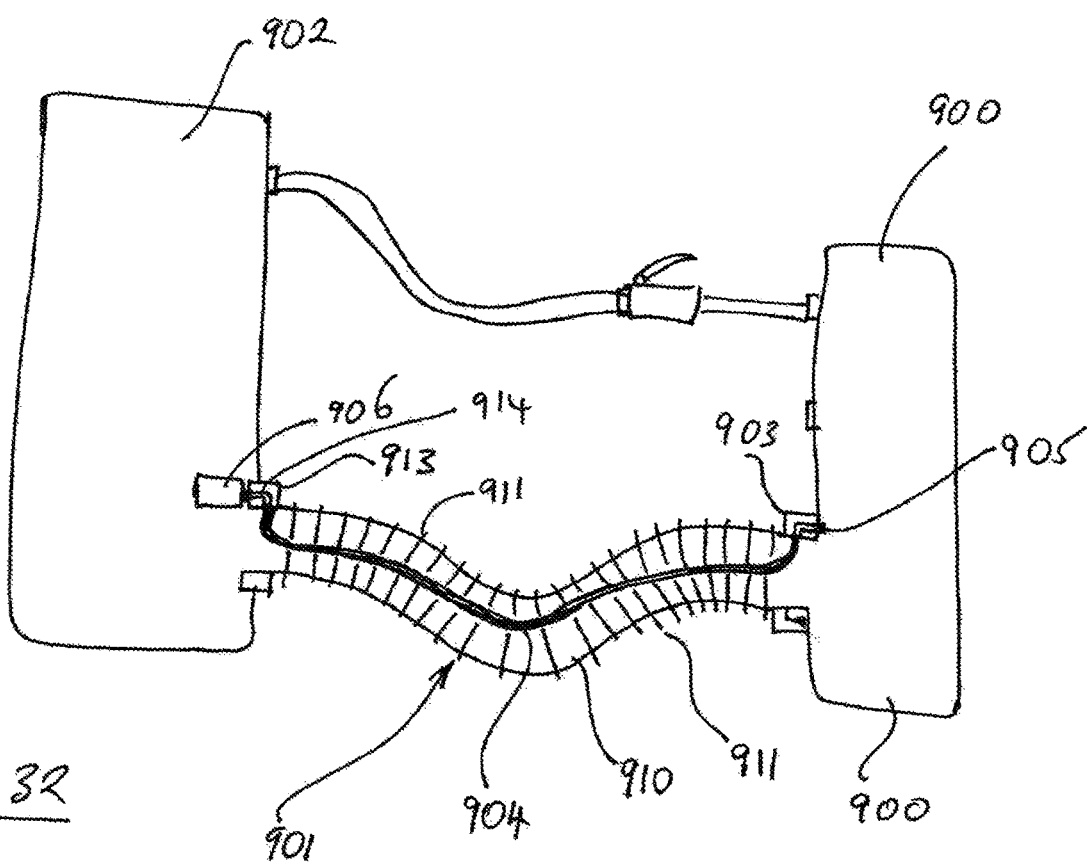
FIG. 32 is a schematic view of an enclosure of components of the invention and an enclosure being cleaned, these two enclosures being connected by a duct through which gas and particulate matter is withdrawn from the enclosure being cleaned. The duct is shown in section.
Figure 33:
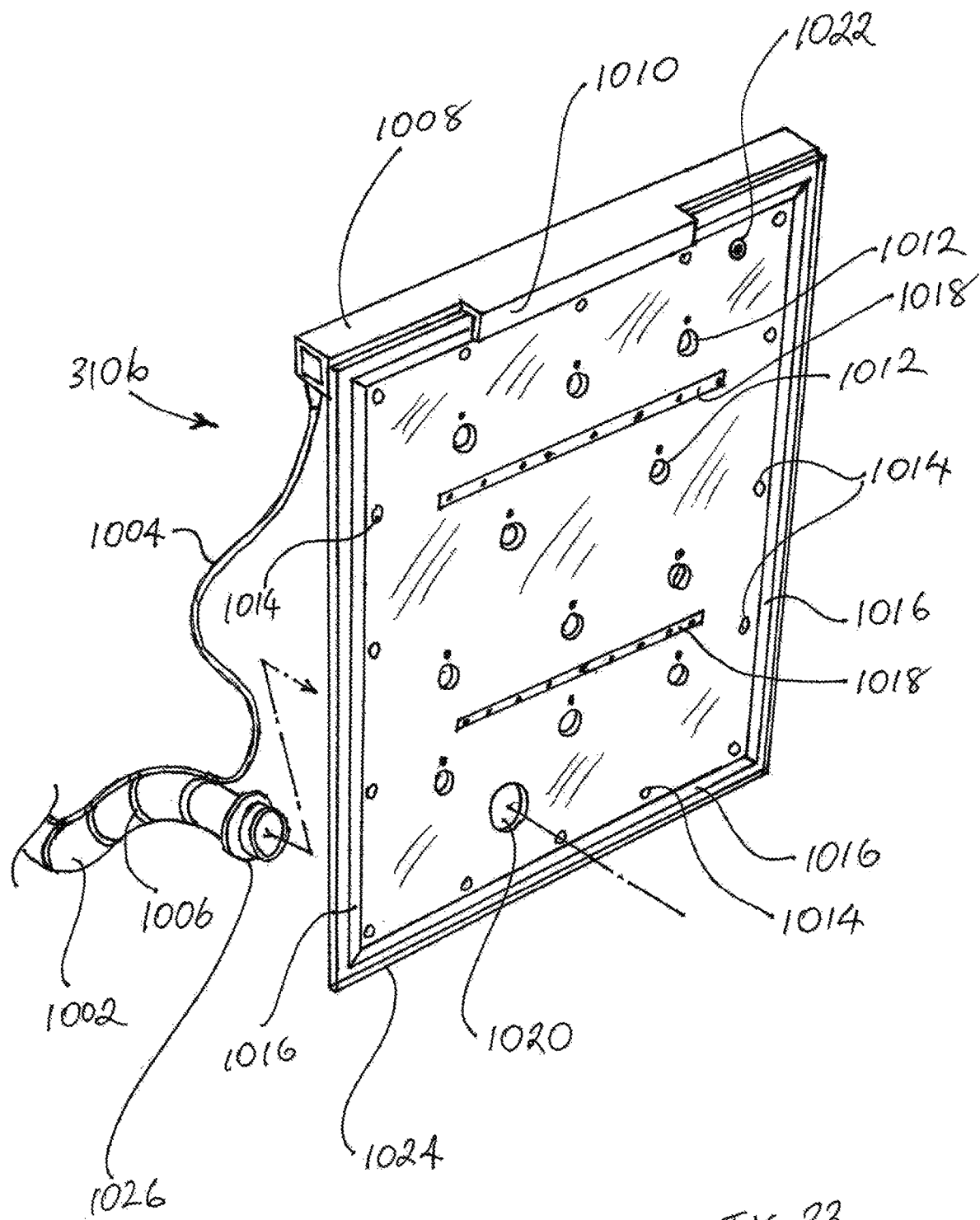
FIG. 33 is a perspective view of yet another cover assembly according to the invention.

Referring to FIG. 2, in practical realisations of the invention, many, most or all of the sensors provided may be in an enclosure that is separate from the enclosure being cleaned and connected to the latter by the conduits 34 and 20. However, the measurement of pressure with the enclosure being cleaned is particularly important and sensing of that pressure is desirably done at a point within the enclosure being cleaned. As an alternative to a sensor at a station such as station C with an electrical connection for its output to an enclosure containing the other components left of station "XX" in FIG. 2, it is possible instead to provide an orifice opening into the enclosure being cleaned and in fluid communication through a flexible tube with a sensor (pressure transducer) located in the enclosure containing those other components. FIGS. 32 and 33 show two ways to do this.

FIG. 32 shows an enclosure 900 being cleaned, with a duct 901 (corresponding to duct 20 of FIG. 2) connecting the interior of enclosure 900 to an enclosure 902 containing the components shown to the left of station "XX" in FIG. 2. Duct 901 is of the known type having a flexible tube 910 held open by a spiral formation 911 such as a wire.

A small-diameter tube 904 enabling an orifice 905 open to the interior of the enclosure 900 to connect to a sensor 906 in enclosure 902 may conveniently be provided inside the flexible duct 901, with the tube 904 terminating in the orifice 905 in a fitting 903 by which the duct 901 is secured to the enclosure 900. At its other end, tube 904 terminates at a fitting 913 with a passage 914 in fluid communication with a pressure transducer 906 in enclosure 902.

Another possibility is to eliminate tube 904 and provide instead that the duct 901 is again of the type having a flexible tube 910 held open by a spiral formation 911, but in which that spiral formation is itself hollow along its length, so as to be in effect a small-diameter tube. The orifice 905, in fitting 903, is in this case in fluid communication with the hollow interior (not shown) of the spiral formation 911. At the other end of the duct 901, the spiral formation 911 and its interior (lumen) is in fluid communication via passage 914 in fitting 913 with the pressure sensor 906 in enclosure 902.

In each of these two arrangements, it is appropriate to provide at the orifice that opens into enclosure 900 a plug or cover, for example of sintered metal, (not shown) adapted to prevent clogging of the orifice, which could adversely affect the pressure measurement.

To disclose yet further additional options for covers according to the invention, FIG. 33 shows a cover 310*b* that is an alternative to covers 310, 310*a*, and 310*c*. Cover 310*b* comprises a single transparent plastics panel 1024 shaped and proportioned to fit over an opening into an internal space of an enclosure (not shown). Cover 310*b* is provided with multiple ports 1012 of the type shown in FIGS. 18 and 19, located specifically in positions that provide optimal access for a cleaning lance such as lance 12. There is also a port 1020 that in use of the cover 310*b* receives an end fitting 1026 of an outlet conduit 1002 for gas and entrained particulate matter that corresponds in function to conduit 20 of FIG. 2.

Banks 1018 of light emitting diodes (LEDs) are provided on the internal-space-facing face of panel 1024 for internal lighting of the internal space. The LEDs are protected by transparent or translucent elongate covers glued or otherwise secured to panel 1024. Extending around the periphery of panel 1024 is a seal 1016 that in use of cover 310*b* lies between panel 1024 and a facing part of the enclosure being cleaned. Seal 1016 may be formed from rubber or a rubber-like material or other material (for example felt) to provide at least some degree of sealing against gas and particulate leakage as cover 310*b* is pushed against the enclosure by the difference between atmospheric pressure and the partial vacuum maintained in the enclosure. Perfect sealing is not essential where there is a partial vacuum in the enclosure.

Two additional provisions are made for holding the cover 310*b* in place. First, magnets 1014 are secured in recesses in panel 1024 and pull panel 1024 toward the enclosure (if it is ferromagnetic). Second, a formation 1010 is provided whereby the cover 310*b* can be hooked onto an upper edge of a flange (not shown) on the enclosure, in the same way as described for covers 310 and 310*c*.

Two forms of sensor are provided on cover 310*b*. First, a pressure sensor 1022 is provided for sensing pressure inside the enclosure, having a pressure-sensitive diaphragm or surface (as opposed to a small hole leading to such diaphragm or surface) so as to be immune from clogging with particulate matter. Second, at each port 1012 there is provided a sensor (not shown) that indicates whether the port is "open" (i.e. in use to accommodate a cleaning lance such as lance 12) or closed. The sensor may be of any suitable type (for example a microswitch or a Hall effect proximity sensor.

To direct power to the sensors and LED banks 1018 and to allow transmission of their outputs to other parts of the system a connecting cable 1004 is provided that is secured (at 1006) by tape, suitable clips or the like to duct 1002. Necessary electronics, signal conditioning for the sensors and power connections (not shown) are protected in a housing 1008 secured to panel 1024, at which an end of cable 1004 terminates. Note that with suitable end fittings for outlet conduit 1002, it is possible to run cable 1004 inside conduit 1002, thus reducing the risk of damage to cable 1004.

As an alternative to cable 1004, it is possible to provide for signals from the sensors on cover 310*b* to be transmitted to the rest of the system by a short-range wireless connection for example using the "Bluetooth" or "Bluetooth Low Energy" or other suitable protocol. In this case, housing 1008 may contain a battery for supplying power to the sensors as required and to the LED banks 1018. Note that as a further alternative, the functions of housing 1008, pressure sensor 1022 may be provided in a housing secured temporarily or even permanently to the enclosure to be cleaned.

Note also that in embodiments where the pressure sensor for internal space pressure is to be located elsewhere in the system and connected to a tapping in a cover such as 310, 310*b* or 310*c*, a flexible tube can be provided terminating at a tapping in the cover and secured along duct 1002 as shown in FIG. 33, although such embodiments are not preferred.

Outlet conduit 1002 (or other outlet conduits described herein) that correspond to outlet conduit 20 of FIG. 2 are preferred to have smooth inner wall surfaces to avoid fouling with particulate material. Thus wire reinforced hose having a non-smooth inner surface is less preferred than hose with a smooth inner wall surface.

Example of the System

Figure 34:
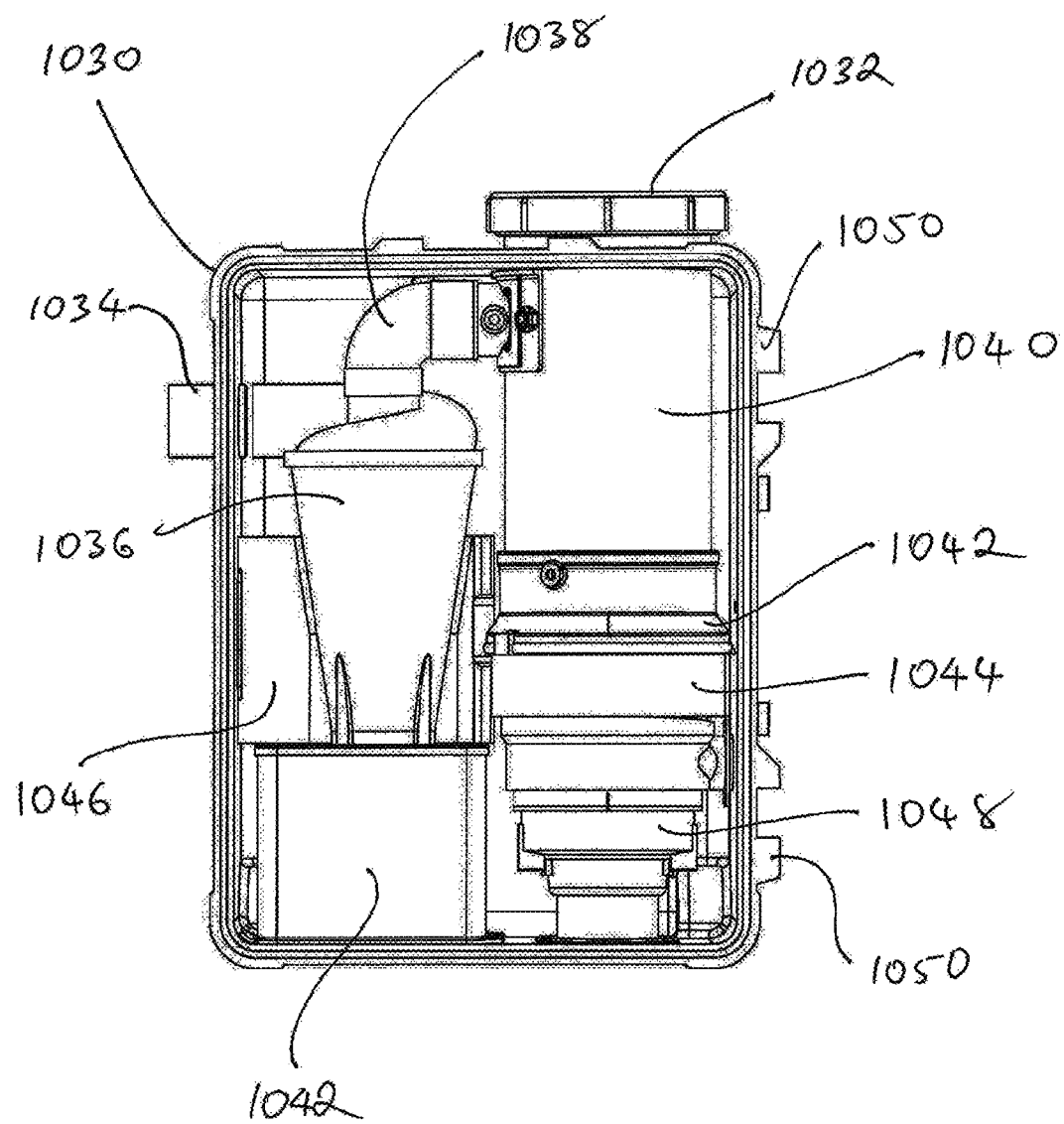
FIG. 34 is an elevation of a portion of a prototype system according to the invention.

A prototype system according to the invention was developed and has proved satisfactory for cleaning electrical component cabinets on large surface mining haul trucks. The system used a conventional reticulated workshop air supply as its gas source (item 32 of FIG. 2) and the components to the left of station "XX" in FIG. 2 (excluding selector 50 which was not included) and were able to be accommodated in a suitcase-sized plastics casing 1030 suitable for carrying as a backpack. FIG. 34 is an elevation showing how the major components (only) were able to be accommodated in the casing. Casing 1030 is shown without its lid, which is hinged at moulded fittings 1050.

A cyclone corresponding to cyclone 38 of FIG. 2 is shown at 1036, with its inlet for gas and particulates drawn from enclosures shown at 1034. Item 1042 is a container inside which is a receptacle (not shown) for collection of particulates received from the cyclone at 1036, the receptacle being emptiable when an ultrasonic transducer pair (sender and receiver, not shown) provides a signal indicating it is full.

At 1038 is a duct from the cyclone at 1036 leading to a cylindrical casing 1040 containing firstly a disposable paper bag-type filter (not shown in FIG. 34) receiving gas and unremoved particulates from the duct at 1038, and secondly a HEPA filter downstream of the paper-bag-type filter. At 1032 is a screw cap for accessing the interior of casing 1040 for removal and replacement of the paper-bag filter and removal and servicing of the HEPA filter.

The source of vacuum for drawing gas and particulates through the system is shown at 1044 (casing for a centrifugal or blower fan (not visible) and 1048 (motor for the fan). Gas leaves the system via a muffler 1046 via a port (not visible) at the left side of the casing 1030.

Not shown in FIG. 34 are triboelectric sensors for sensing particulate concentration at locations corresponding to stations F and K of FIG. 2. Electronics componentry (not shown) is housed in the lid (not shown) of the casing 1030. Pressure transducers for locations corresponding to stations C, F, G, H and I of FIG. 2 are mounted on a printed circuit board in the lid and connected to those locations by small-bore flexible plastics tubes.

Also housed in the lid is a relay-operated valve corresponding to item 52 of FIG. 2 for controlling gas supply to the lance (not shown), and in particular shutting off that supply if pressure in the enclosure being cleaned rises to become too close to pressure in the surroundings (i.e. if there is a risk of loss of partial vacuum in the enclosure being cleaned).

Figure 35:
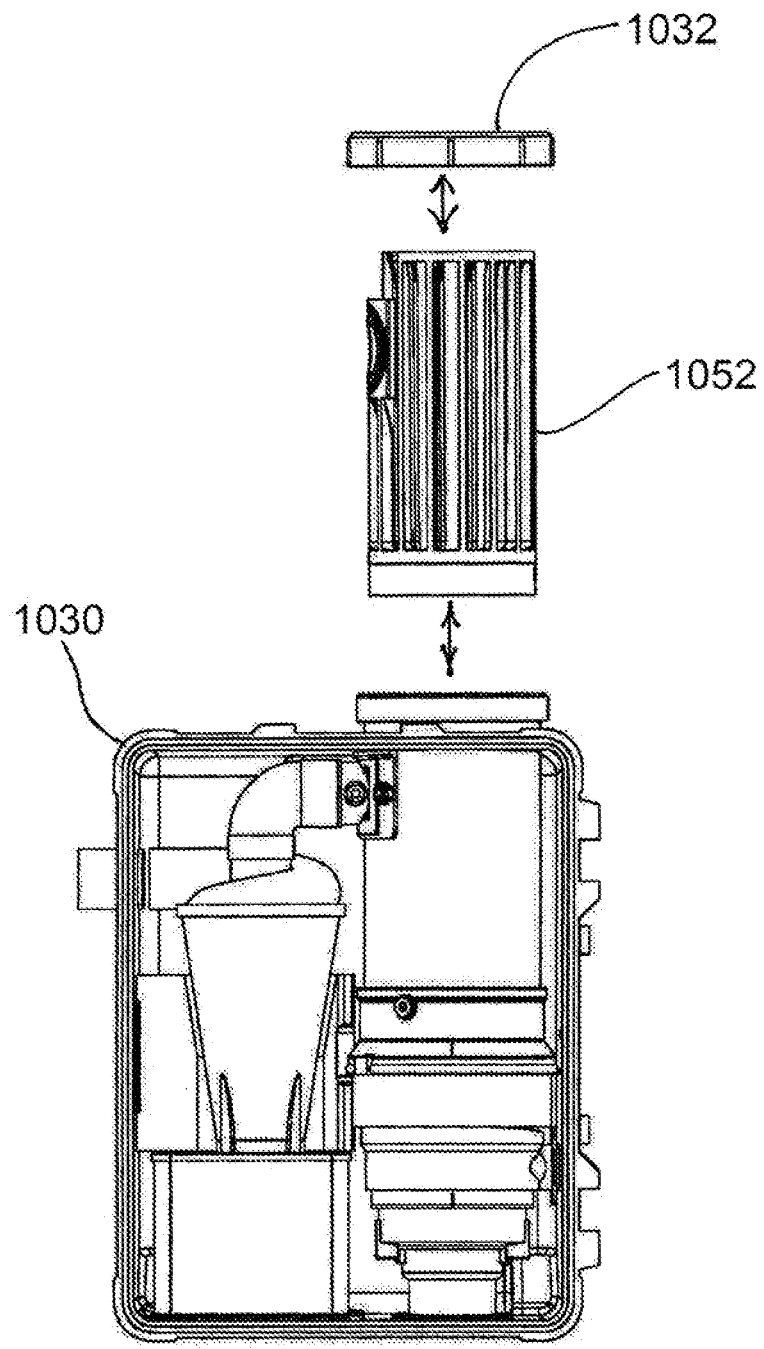
FIG. 35 is an exploded view of the prototype portion shown in FIG. 34, now with a filter holder and screw cap removed as if for emptying of filter bag.
Figure 37:
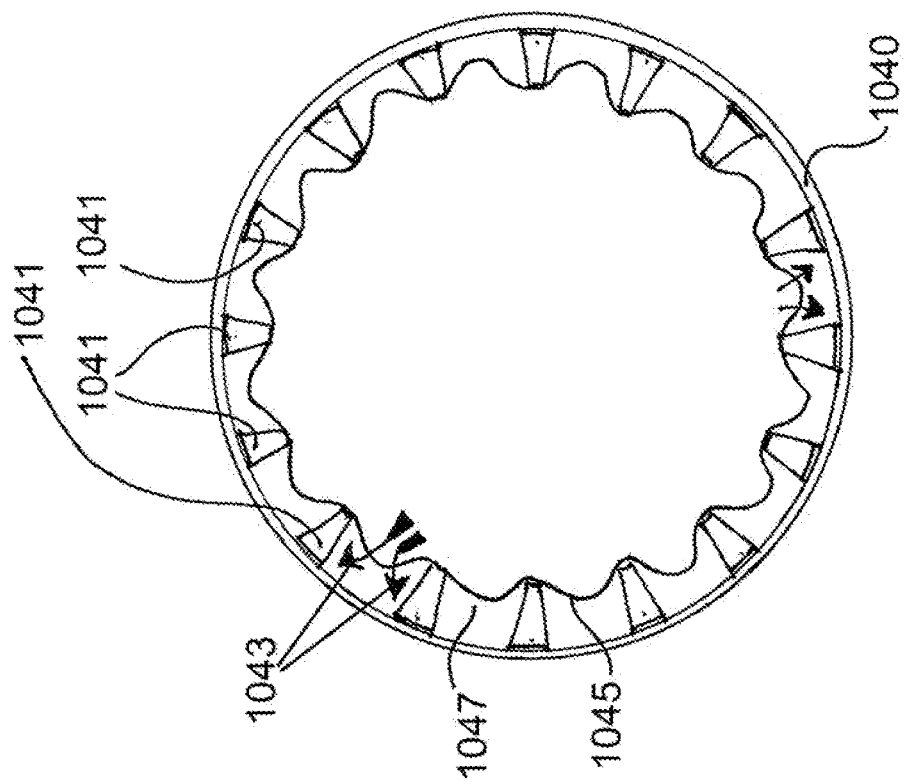
FIG. 37 is a transverse sectional view of the holder of FIG. 36 in use with a contained filter bag, the section being taken at station "A" of FIG. 36.
Figure 36:
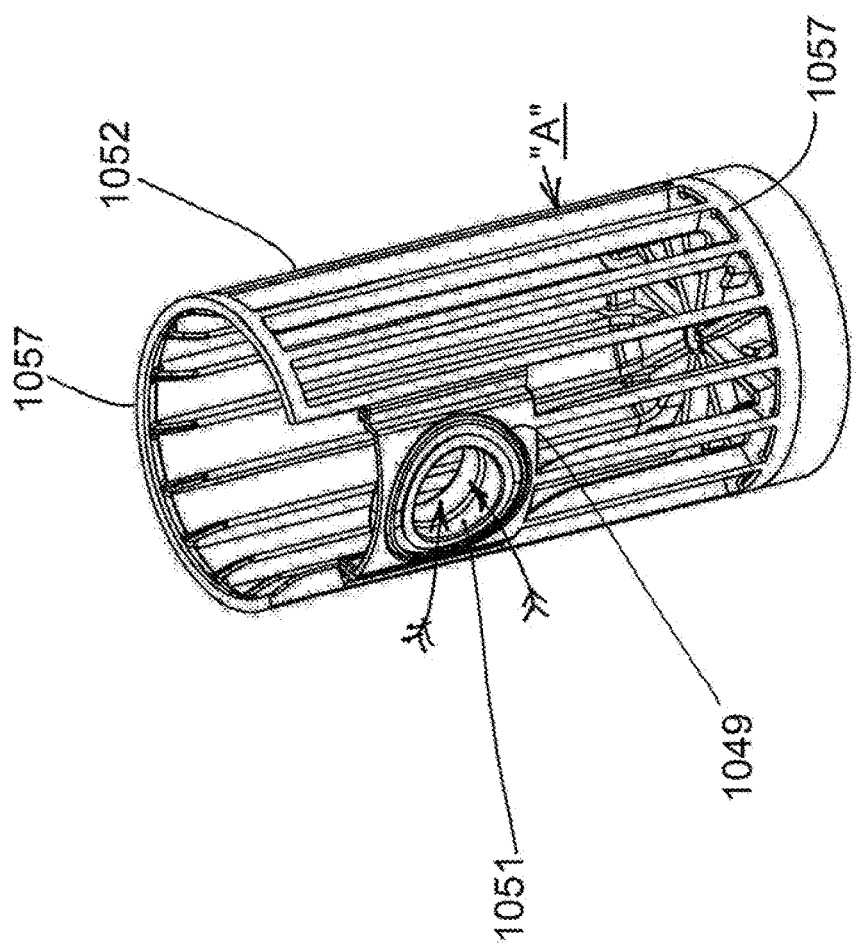
FIG. 36 is a perspective view of an elongate filter bag holder for use in the invention.

FIG. 35 shows the casing 1030 in the same elevation as FIG. 34 but now with screw cap 1032 removed and a filter bag holder 1052 removed from casing 1040 as is required for emptying. Bag holder 1052 (shown in FIG. 36) comprises a plastics moulding in which vertical bars 1041 are arranged in a circle supported by circular parts 1057. No filter bag is shown in FIG. 36, for clarity. As can be seen in the sectional view of FIG. 37, bars 1041 lie adjacent to the wall of casing 1040 when holder 1052 is placed in casing 1040. Filter bag 1045 is held away from the wall of casing 1040 by bars 1041 when, in use, there is gas under pressure in bag 1045. This ensures that between each pair of adjacent bars 1041 there is a space 1047 into which and down which gas passing through bag 1045 can pass as shown by arrows 1043. Holding the bag away from casing 1040 in this way ensures that a large portion of the bag's surface is available for catching particulate material entrained in the gas in the bag 1045. Item 1059 defines a space above the HEPA filter (not shown) so that its whole cross-sectional area is used.

The filter bag used in holder 1052 in the prototype is a commercially available porous paper filter bag having a circular opening. Gas and particulates enter the bag through a short duct 1051 that is separate from holder 1052 but is received therein as shown. A seal 1049 is provided on duct 1051 that when the bag is placed in holder 1052 seals against the inner wall of casing 1040.

A further possible refinement of the invention will now be described. In the description supporting FIG. 3, mention was made of sensors for the state of the various ports 1012. The functionality of FIG. 3 may be expanded to include sensing of the state of ports 1012 during a cleaning session, to provide to supervisors and/or others an indication of how the operation was carried out. For example, were all of ports 1012 used at some point? For how long? Moreover, it is possible to provide through system 199 a defined sequence to be followed in cleaning a particular enclosure and to display prompts to an operative as to that sequence at block 208.

Still another possible refinement is to expand the functionality of the system as shown in FIGS. 2 and 3 to provide for data to be received from sensors of operator comfort, for example temperature at the worksite or inside protective clothing of an operative carrying out a particulate removal operation.

In the above descriptions, many specific embodiments have been described. However, it is to be understood that features of those embodiments may be used where practicable in other combinations than those explicitly shown to suit particular circumstances. For example only, other embodiments may include features selected from at least the following non-exhaustive list:

- Covers for enclosures may be permanent or adapted for temporary use, may be produced by modifying existing doors or other closures or made new to provide for cleaning as described, may be transparent or not, may have viewing windows or not, may be "dished" (as in FIG. 14) or not, may have LED or other lighting provided in the enclosure or incorporated in the cover used. Covers may be secured in place by hanging from existing or dedicated parts of enclosures to be cleaned or not, and/or by clamps of any type described or other suitable types, or partly or wholly by maintenance of below-atmospheric pressure in the enclosure. Contact between the interior space and the cover need not be on a plane, even though the particular embodiments described do have that property. Where covers are transparent or have transparent portions, anti-scratch treatments as known in the art may or may not be applied.
- Sealing arrangements for covers may be pneumatically inflated or not, and may be secured to a cover or on the enclosure to be cleaned.
- There may be one or several outlet ducts for gas and entrained particulates.
- Port assemblies of any of the types described (items 86, 158, 200, 340), or others that allow introduction to the enclosure of a cleaning lance without excessive leakage of particulates and/or gas, may be provided in a cover used as described. It is even possible, where pressure in the enclosure being cleaned is always kept below atmospheric during cleaning, to simply provide holes in a cover through which a cleaning lance can be inserted. Ports of different types (including those described herein) may be used in combination in one cover.
- Any or all of the sensor types mentioned, or other types known in the art and consistent with the functions described may be used, in the locations shown or other suitable locations.

Pressure in an enclosure being cleaned may be automatically or manually controlled.

Movement of cleaning lances or other fittings (such as the nozzle arrangements shown in FIGS. 20 and 21) may be automatic or manual. Note that in some applications, it may not be necessary for gas nozzles to be movable at all, to achieve adequate cleaning for particular purposes.

Separation technologies for removing particulates from gas streams (e.g. textile bags or other filters or cyclones may be provided in suitable numbers and/or combinations.

Any suitable means of supplying gas for cleaning may be used and gas may be used once or recycled within the system. For example, gas from outlet 53 in the arrangement shown in FIG. 2 may be recycled, in whole or in part, to constitute or be comprised in gas source 32.

The apparatus and methods described herein may be adapted to removal of particulate matter from various entities, with various geometries. FIG. 28(a) represents schematically applications of the type disclosed above, showing in section a cover 700 (corresponding to cover 310 for example) is fitted over an opening 702 of a cavity 704 in an object 706. Item 708 is a cleaning lance (similar to lance 12), items 710 are ports (similar to ports 340), item 712 is an outlet duct (similar to duct 20), and item 714 is a seal (similar to seals 318 or 321).

FIG. 28(b) represents schematically an application to removal of particulate matter from a surface 716. Hood 718 (shown in section) is positioned to abut surface 716 with a seal 728 extending around the area of surface 716 covered by hood 718. Cleaning lance 722 extends through one of several ports 720 in hood 718. 726 is an enclosed space defined between surface 716 and hood 718. An outlet duct 724 is provided for removal of gas and particulate matter.

FIG. 28(c) represents schematically an application where an object 730 is to have particulate matter received and is covered for the purpose by a cover 734 that abuts a surface 732. Cleaning lances 736 extend through ports 738 and are moved as required. Seal 740 limits or prevents leakage between cover 734 and surface 732.

Although examples (a), (b) and (c) all show covers (700, 718, 734) that can abut a flat surface, this is not essential. Where an application requires it, the boundary between cover and the entity it abuts in use need not be planar.

Note also that the object 730 could be an object, or surface 732 could be a surface, on which some particulate-generating process is being carried out, for example sanding, grinding or "scabbling". Although not shown, the apparatus and methods described may be adapted to contain, and enable removal of, particulates in such cases also, for example by providing an extra access port in the cover for equipment used in the process or for the arm of an operator reaching into the cover.

Note finally that covers according to the invention need not necessarily be shaped to cover a flat surface (such as a flange around an opening of an electrical cabinet). Covers for performing the invention (in the same way as covers 310, 310a, 310b and 310c) may be contoured to suit other enclosure geometries. For example, large electric motors (not shown) s may have openings for access to brushes and commutators, and these are components that may need to be cleaned. It is possible to make a cover similar for example to cover 310b (FIG. 33) save that it is arcuately shaped to cover such an opening during cleaning. In this case, however, ports such as ports 1012 and port assemblies 340 are unsuitable. However, port assemblies of the type shown in FIG. 4 can be used, with at least one slit disc (the same as disc 94) having its slit (corresponding to slit 96) parallel to the motor shaft.

The invention claimed is:

1. An apparatus for removing particulate matter from an enclosure having an internal space and an opening into the internal space, comprising:
    a cover securable to the enclosure so that the cover covers the opening, the cover comprising multiple access ports;
    a blower for establishing at its gas inlet a partial vacuum for drawing gas and particulate matter entrained therein from the internal space through an exhaust conduit in fluid communication with the internal space thereby maintaining a partial vacuum within the internal space; and
    a lance connectable to a gas supply external to the enclosure for use;
    wherein:
    the lance is configured to be hand-held, by a user outside the enclosure, and comprises a valve operable by the user to vary a flow of gas into the lance, and an elongate tube for direction of gas from the valve to an open end of the tube;
    each access port is configured for insertion, by the user, of at least a portion of the elongate tube slidingly therethrough and to limit fluid movement into and out of the internal space both when the tube is received therein and when the tube is not received therein;
    each access port is configured to permit the user, by manipulation of the lance, to vary both an orientation of the tube relative to the cover and an extent of penetration of the tube into the internal space;
    wherein when the tube is slidingly inserted through any one or more of the ports of the cover and the valve is operated by the user to enable the flow of gas into the lance, particulate matter within the internal space is dislodged by gas flowing from the open end of the tube, entrained in gas within the internal space and thereafter drawn from the internal space through the exhaust conduit.

2. The apparatus of claim 1, wherein the cover is configured for use with the enclosure by positioning the access ports on the cover to enable the open end of the tube comprised in the lance to be positioned by the user in specified locations and orientations relative to objects in the internal space of the enclosure when the cover is secured over the opening into the internal space in a specified position.

3. The apparatus of claim 2, further comprising at least one of a filter, multiple filters, and a cyclone separator, that separate entrained particulate matter from gas that has been drawn from the internal space; and
    wherein the blower is downstream of the at least one of the filter, multiple filters, and the cyclone separator.

4. The apparatus of claim 3, wherein at least a portion of the gas leaving the blower is included in the gas supply to the lance.

5. The apparatus of claim 1, wherein the exhaust conduit is secured to the cover at an opening in the cover, and wherein gas and entrained particulate matter is drawn from the internal space into the exhaust conduit through the opening in the cover.

6. The apparatus of claim 1, wherein at least a portion or substantially all of the cover is transparent.

7. The apparatus of claim 1, wherein the cover further comprises one or more light sources configured to illuminate the internal space.

8. The apparatus of claim 1, wherein each of the access ports comprises at least one elastomeric element having a slit formed therein through which slit the tube comprised in the lance can be inserted.

9. The apparatus of claim 1, wherein the enclosure opening is implemented as a non-flat surface, and wherein the cover is shaped to cover the non-flat surface of the enclosure opening.

10. The apparatus of claim 1, further comprising a particulate concentration sensor that senses a concentration of the particulate matter that is entrained in the gas being drawn from the internal space.

11. The apparatus of claim 10, further comprising a sensor that senses a difference in gas pressure between the internal space and the atmosphere outside the enclosure.

12. The apparatus of claim 11, wherein the valve comprised in the lance or a further valve is operable automatically to interrupt gas flow through the lance if the sensed difference in gas pressure is outside a specified range.

13. The apparatus of claim 11, further comprising sensors that sense at least one of:
a gas pressure drop through a filter, multiple filters, or a cyclone separator used for removing particulates from gas leaving the enclosure;
a gas pressure at a gas entry to the lance;
a temperature of gas in the internal space;
a gas temperature at the blower;
a position of the cover relative to the enclosure;
a particulate concentration downstream of the blower in gas leaving the apparatus and being discharged into the atmosphere;
a flow rate of gas into the lance; and
for each access port, whether the tube comprised in the lance is inserted in the access port.

14. The apparatus of claim 13, further comprising at least one microprocessor configured to:
receive data from sensors comprised in the apparatus, including data relating to both operation of parts of the apparatus and data relating to particulate removal obtained through use of the apparatus;
drive displays of data from sensors comprised in the apparatus, the displays being localized to the apparatus for use by a user of the apparatus; and
drive alarms when the sensor data indicates an abnormal operating condition.

15. The apparatus of claim 14, wherein the microprocessor is configured to assemble data derived from cyclic scanning of the sensors comprised in the apparatus and to write to a digital storage device the assembled data including data relating to both operation of parts of the apparatus and data relating to particulate removal obtained through use of the apparatus.

16. The apparatus of claim 14, wherein the microprocessor is configured to transmit to a remote location, via a communications interface, data in digital form derived from cyclic scanning of sensors comprised in the apparatus, including data relating to both operation of parts of the apparatus and data relating to particulate removal obtained through use of the apparatus.

17. The apparatus of claim 10, further comprising a display viewable by the user that displays at least one of:
particulate concentration in the gas leaving the internal space; and an OK/Not-OK indication derived from the particulate concentration in the gas leaving the internal space.

18. A method for removing particulate matter from an enclosure having an internal space and an opening into the internal space, comprising steps of:
connecting a gas supply external to the internal space to a lance configured to be hand-held by a user outside the enclosure, the lance comprising a valve operable by the user to vary flow of gas into the lance, and an elongate tube for direction of gas from the valve to an open end of the tube;
securing a cover to the enclosure that covers the opening into the internal space, the cover having multiple access ports, each access port being configured for sliding insertion by the user of at least a portion of the tube therethrough, to permit the user by manipulation of the lance to vary both an orientation of the tube relative to the cover and an extent of penetration of the tube into the internal space, and to limit fluid movement through the access port both when the tube extends through the port and when the tube does not extend through the port;
activating a blower for drawing gas and particulate matter entrained therein from the internal space through an exhaust conduit in fluid communication with the internal space, thereby maintaining a partial vacuum within the internal space;
inserting the tube into a selected one of the access ports, and positioning and orientation of the lance when the tube is received in the access port to direct air from the open end of the tube lance within the internal space; and
dislodging particulate matter within the internal space by movement of gas from the tube open end when the tube has been slidingly inserted by the user into the access port of the cover and the valve has been operated by the user to enable the flow of gas into the lance so that the particulate matter is entrained in gas in the internal space and drawn therefrom by the blower.

19. The method of claim 18, further including a step of separating particulate matter from the gas leaving the internal space by at least one of a filter, multiple filters, and a cyclone separator, located upstream of the blower.

20. The method of claim 19, including the step of sensing by a particulate concentration sensor a concentration of particulate matter that is entrained in gas being drawn from the internal space.

21. The method of claim 20, further including a step of sensing a gas pressure difference between the internal space and the atmosphere outside the enclosure.

22. The method of claim 21, further including a step of automatically interrupting a flow of gas to the lance in the event the gas pressure difference falls outside a specified range.

23. The method of claim 20, further including a step of:
displaying on a display, viewable by the user of the lance, at least one of: the concentration of the particulate matter as sensed by the particulate concentration sensor; and an OK/Not-OK indication derived from the particulate concentration in the gas leaving the internal space.

24. The method of claim 19, further including a step of providing and operating sensors to sense at least one of:
a gas pressure drop through a filter, multiple filters, or a cyclone separator used for removing particulates from gas leaving the enclosure;

a gas pressure at a gas entry to the lance;
a temperature of gas in the internal space;
gas temperature at the blower;
a position of the cover relative to the enclosure;
a particulate concentration downstream of the blower in gas leaving the apparatus and being discharged into the atmosphere;
a flow rate of gas into the lance; and
for each access port, whether the tube comprised in the lance is inserted in the access port.

25. The method of claim 24, further including a step of, by a microprocessor configured to receive data from the particulate concentration sensor and other sensors in use in the method, cyclically scanning output of the particulate concentration sensor and the other sensors in use in the method, and writing data derived from cyclically scanning the output of the particulate concentration sensor and the other sensors in use in the method to a storage device.

26. The method of claim 25, further including a step of, by the microprocessor, transmitting data derived from the cyclic scanning of the particulate concentration sensor and the other sensors in use in the method to a location remote from the enclosure in digital form via a communications interface.

27. The method of claim 24, further including a step of, by a microprocessor configured to receive data derived from cyclic scanning of the sensors in use, writing to a digital storage device data relating to both particulate removal and operation of equipment in use in the method.

28. The method of claim 24, further including a step of, by a microprocessor configured to receive data derived from cyclic scanning of the sensors in use, transmitting data relating to both particulate removal and operation of equipment in use in the method to a location remote from the enclosure in digital form via a communications interface.

* * * * *